US011293979B2

(12) United States Patent
Wang

(10) Patent No.: US 11,293,979 B2
(45) Date of Patent: Apr. 5, 2022

(54) METHOD OF AND AN ARRANGEMENT FOR ANALYZING MANUFACTURING DEFECTS OF MULTI-CHIP MODULES MADE WITHOUT KNOWN GOOD DIE

(71) Applicant: Peter Shun Shen Wang, Gillette, NJ (US)

(72) Inventor: Peter Shun Shen Wang, Gillette, NJ (US)

( * ) Notice: Subject to any disclaimer, the term of this patent is extended or adjusted under 35 U.S.C. 154(b) by 42 days.

(21) Appl. No.: 17/076,496

(22) Filed: Oct. 21, 2020

(65) Prior Publication Data

US 2021/0116497 A1    Apr. 22, 2021

Related U.S. Application Data

(60) Provisional application No. 62/975,835, filed on Feb. 13, 2020, provisional application No. 62/924,488, filed on Oct. 22, 2019.

(51) Int. Cl.
*G01R 31/3177*     (2006.01)
*G01R 31/317*      (2006.01)
(Continued)

(52) U.S. Cl.
CPC ..... *G01R 31/3177* (2013.01); *G01R 31/2815* (2013.01); *G01R 31/3183* (2013.01);
(Continued)

(58) Field of Classification Search
CPC .......... G01R 31/3177; G01R 31/31705; G01R 31/31723; G01R 31/3183;
(Continued)

(56) References Cited

U.S. PATENT DOCUMENTS 5,463,638 A * 10/1995 De Lange ...... G01R 31/318547
714/728
5,477,545 A * 12/1995 Huang ........... G01R 31/318541
324/762.02

(Continued)

OTHER PUBLICATIONS

Flint, A Comparison of Test Requirements, Methods, and Results for Seven MCM Products, 1995, IEEE, pp. 202-207. (Year: 1995).*

(Continued)

*Primary Examiner* — John J Tabone, Jr.
(74) *Attorney, Agent, or Firm* — Chi Eng

(57) ABSTRACT

The present invention provides a reliable method and arrangement for boundary scan testing and debugging newly manufactured multi-chip modules (MCMs) made to identical design specifications with no Known Good Die therein. Advantageously, a first and a second MCM are temporarily linked in tandem for boundary scan testing through a motherboard and daisy-chaining their internal dice, and interlinking the corresponding boundary scan cells of the identical dice of the first and second MCM to (1) run self-test on individual MCMs and mutual test on the MCMs connected in tandem in order to generate an extended Truth Table that includes responses from an array of combined netlists of the first and second MCMs, and (2) to diagnose mismatched bits in the extended Truth Table using a Boundary Scan Diagnostics software so as to identify defects in the first and second MCMs.

21 Claims, 27 Drawing Sheets

(51) Int. Cl.
  *G01R 31/3183* (2006.01)
  *G01R 31/3185* (2006.01)
  *G01R 31/28* (2006.01)

(52) U.S. Cl.
  CPC . *G01R 31/31705* (2013.01); *G01R 31/31723* (2013.01); *G01R 31/318508* (2013.01); *G01R 31/318533* (2013.01); *G01R 31/318597* (2013.01)

(58) Field of Classification Search
  CPC .... G01R 31/318508; G01R 31/318533; G01R 31/318597; G01R 31/2815
  USPC .................................. 714/727, 726, 737, 742
  See application file for complete search history.

(56) References Cited

U.S. PATENT DOCUMENTS

| | | | | | |
|---|---|---|---|---|---|
| 5,544,174 | A | * | 8/1996 | Abend | G01R 31/2815 714/32 |
| 5,568,492 | A | * | 10/1996 | Flint | G01R 31/318555 714/724 |
| 5,646,068 | A | * | 7/1997 | Wilson | H01L 25/0652 438/108 |
| 5,673,276 | A | * | 9/1997 | Jarwala | G01R 31/318513 714/727 |
| 5,983,378 | A | * | 11/1999 | De Wit | G01R 31/318547 714/727 |
| 6,710,616 | B1 | * | 3/2004 | D'Souza | G11C 29/006 324/750.05 |
| 6,807,644 | B2 | | 10/2004 | Reis et al. | |
| 7,661,048 | B2 | * | 2/2010 | Gomez | G01R 31/318533 714/727 |
| 7,818,640 | B1 | * | 10/2010 | Lerner | G01R 31/318555 714/726 |
| 7,941,714 | B2 | * | 5/2011 | Cho | G11C 29/1201 714/719 |
| 8,601,333 | B2 | * | 12/2013 | Van Den Eijnden | G01R 31/31855 714/727 |
| 8,775,883 | B2 | * | 7/2014 | Van Den Eijnden | G01R 31/318538 714/727 |
| 8,970,049 | B2 | | 3/2015 | Karnezos | |
| 2005/0099199 | A1 | * | 5/2005 | Sugita | G01R 31/31926 324/750.3 |
| 2009/0148966 | A1 | * | 6/2009 | Cauvet | G01R 31/3025 438/15 |
| 2012/0126846 | A1 | * | 5/2012 | Jong | G01R 31/318558 324/762.03 |
| 2012/0221906 | A1 | * | 8/2012 | Shetty | G01R 31/31727 714/727 |
| 2014/0264331 | A1 | * | 9/2014 | Yao | H01L 22/14 257/48 |
| 2018/0137005 | A1 | * | 5/2018 | Wu | G11C 11/4093 |
| 2020/0103464 | A1 | * | 4/2020 | Fridburg | G01R 31/318533 |
| 2021/0333326 | A1 | * | 10/2021 | Wang | G01R 31/318536 |

OTHER PUBLICATIONS

Flint, A Simulation-Based JTAG ATPG Optimized for MCMS, 1997, IEEE, pp. 101-105. (Year: 1997).*

Jarwala, Designing "Dual Personality" IEEE 1149.1 Compliant Multi-Chip Modules, 1994, IEEE, pp. 446-455. (Year: 1994).*

Round, Manufacturing Defects Testing of a Multi-Chipmodule Using IEEE 1149.1 Boundary Scan Test and Embedded Built-In Test Software, 1993, IEEE, pp. 151-156. (Year: 1993).*

Zorian et al., Multi-Chip Modules Testing and DFT, 1996, IEEE, pp. 722-725. (Year: 1996).*

* cited by examiner test vector 1 - 10101010 test vector 2 - 01100110 test vector 3 - 00011110 test vector 4 – 00000001
test vector 5 - 01010101 test vector 6 - 10011001 test vector 7 - 11100001 test vector 8 - 11111110

Switching between the corresponding dice to test "SHORT"

Switching between the corresponding dice to test "OPEN"

Switching between the corresponding dice to test "BRIDGING"

```
[=] Sequence Report 1.txt

T-TAP B-TAP  Device   Register   Data                              CAPTURE Test
   1    1   U1000_A   IR         0000000001
            Flag      IR-pattern 1111111111100000000000
        2   U1000_B   IR         0000000001
            Flag      IR-pattern 1111111111100000000000

T-TAP B-TAP  Device   Register   Data                              IDENT Test
   1    1   U1000_A   ID         XXXXXXXXXXXXXXXXXXXXXXXX
        2   U1000_B   ID         XXXXXXXXXXXXXXXXXXXXXXXX T-TAP B-TAP  Device   Register   Data                              TRST Test
   1    1   U1000_A   ID         XXXXXXXXXXXXXXXXXXXXXXXX
        2   U1000_B   ID         XXXXXXXXXXXXXXXXXXXXXXXX 1    3 Test Exec 02_infra infra              Vec    P F  Passed        14:07'12
```

Infrastructure test per third party software test tool set typically used on daisy chained matched dice

Fig. 11A

Truth Table Report (TTR) per third part test software tool set typically used for "Interconnection test"

Fig. 11B

Boundary Scan Diagnostics (BSD) typically used on Truth Table Report (TTR) per third party software tool set

Die 1, 2, 3 daisy-chained from MCM-X to MCM-Y under Infrastructure Test

Truth Table (TTR) shows MCM-Y has error bits on DIE-1Y and its related net list

Fig. 13

Boundary Scan Diagnostic (BSD) chart shows Die-1Y associated pins and nets shorted to VCC

Fig. 15

Truth Table Report (TTR) shows MCM-X has error bits on Die 2X and 2Y at nets indicated by shaded areas Boundary Scan Diagnostics (BSD) shows Die 2X and Die 2Y failed due to open in net Truth Table (TTR) shows MCM-X & Y have error bits on Die 3X & 3Y and their related net list

Fig. 17

Boundary Scan Diagnostic (BSD) chart shows Die-3X & 3Y associated pins and nets bridging

Fig. 18

Reworked Dice after trouble-shooting, both MCMs pass the mutual test on TTR

Fig. 19

| | | |
|---|---|---|
| PCIE_A_REFCLK_P | out bit | P channel (Boundary Scan cells) |
| PCIE_A_REFCLK_M | out bit | N channel (linkage bit) |
| PCIE_B_REFCLK_P | out bit | P channel (Boundary Scan cells) |
| PCIE_B_REFCLK_M | out bit | N channel (linkage bit) |
| QLINK_CLK_P | inout bit | P channel (Boundary Scan cells) |
| QLINK_CLK_M | inout bit | N channel (linkage bit) |
| QLINK_UDL1_P | inout bit | P channel (Boundary Scan cells) |
| QLINK_UDL1_M | inout bit | N channel (linkage bit) |
| QLINK_UDL2_P | inout bit | P channel (Boundary Scan cells) |
| QLINK_UDL2_M | inout bit | N channel (linkage bit) |

BSDL illustrates mixed Boundary scan cells and linkage bits on the same die

Fig. 20

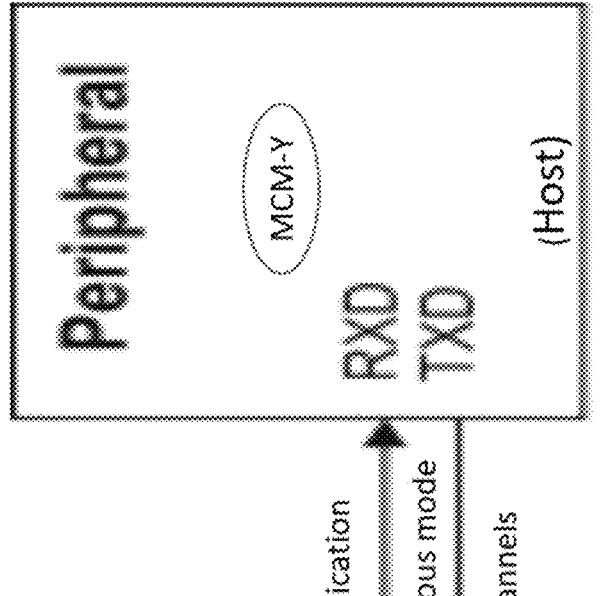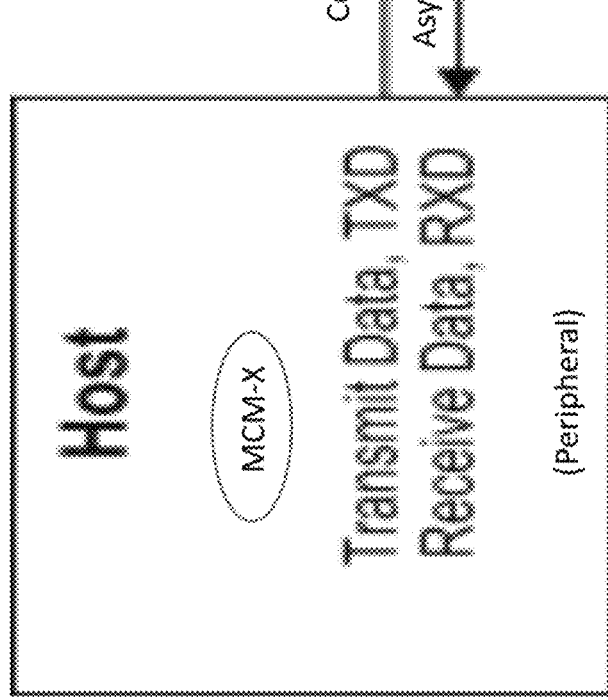
Fig. 21
Boundary scan cells working with linkage bits in "2x2 matrix" configuration

Fig. 22

Boundary scan test "fail" when MCM-Y working at "Peripheral" end

Function tests of linkage bits in time domain during asynchronous mode transmission Boundary scan test of MCM-Y "pass" when working at the "Host" end

METHOD OF AND AN ARRANGEMENT FOR ANALYZING MANUFACTURING DEFECTS OF MULTI-CHIP MODULES MADE WITHOUT KNOWN GOOD DIE

CROSS REFERENCES TO RELATED APPLICATIONS

This application claims priority from U.S. Provisional Application No. 62/924,488 filed on Oct. 22, 2019 and U.S. Provisional Application No. 62/975,835 filed on Feb. 13, 2020, the disclosure of which is incorporated herein by reference in its entirety.

FIELD OF INVENTION

The present invention relates to the field of determining manufacturing defects of JTAG compliant devices, and more particularly, to a method and an arrangement for analyzing manufacturing defects in multi-chip modules (MCMs) made without known good die (KGD) by innovatively linking two or more MCMs in tandem and boundary scan testing the linked MCMs in a repetitive and reciprocal manner.

BACKGROUND OF THE INVENTION

It has been a common practice in the semiconductor chip manufacturing industry to fully test dice prior to their chip packaging onto circuit boards in order to avoid costly return of merchandise. A "Known Good Die" (KGD) is a fully tested chip prior to its placement in a multi-die package; such a classic approach is traditionally available to low pin count devices like RF and analog, passive devices in which a die is bonded on a ceramic substrate, and housed in a conventional metal can or plastic package. This process is time consuming and expensive and is generally only suitable for single die package. However, the advent of multi-chip modules (MCMs) renders this methodology impractical, if not obsolete. MCMs typically comprise dice with thousands of I/O pads that are stacked atop each other and surface mounted to a thin film ceramic, polyimide or silicon substrate making contacts via an array of eutectic solder bumping, i.e. gas vapor grown solder balls, and packaged into Ball Grid Array (BGA) based chip carrier. Applications of such packaging technology includes even more complicated IC designs such as System in Package (SiP) or System on Chip (SoC) wherein multiple dice are stacked in three-dimension and assembled in a complex package, which may be viewed as chips in IC and/or IC in chips; especially when SiP and SoC have gained wide adoption in the computing industry, artificial intelligence (AI) technologies, and automatous vehicles.

Boundary scan testing, standardized in IEEE 1149.1 and its progeny (also known as JTAG and entitled "Standard Test Access Port and Boundary-Scan Architecture"), is employed to test the electrical integrity of a circuit or device without requiring the use of probes (i.e., a technique that uses metallic needles to physically contacting each I/O pin associated pads); instead the JTAG uses silicon nails, to avoid destruction of needles, and each silicon nail has been embedded with boundary scan cells.

Such circuit and device, however, must comply with the Boundary Scan Description Language (BSDL) specification, which specifies a device to have built-in boundary scan cells (or test registers), each pin mapped to a silicon nail based I/O port of the device, and a protocol that implements a serial communications interface for accessing chip associated identification (ID), Instruction Registers (IR), Data Registers (DR), Bypass Registers (BR) etc. The interface connects to an on-chip Test Access Port (TAP) that implements, in conjunction with a boundary scan test controller internally, to exercise a state machine protocol, to drive and sense the boundary scan cells that present a chip at logic bits of the gates, and an external controller that provides the various capabilities and properties to work with different JTAG compliant devices made by different IC manufacturers. This internal TAP controller manipulates the test functions in each chip in response to TDI (Test Data In), TDO (Test Data Out), TMS (Test Mode Select), TCK (Test Clock), and an optional TRST (Test Reset) from an integrated circuit (IC) on a circuit board. Typically, multiple devices on a circuit board can have their JTAG lines daisy-chained together in a serial manner (e.g., Infrastructure test), and to test their associated netlists such as data, address and control buses in a parallel manner (e.g., Interconnection test), to thereby diagnose possible causes of errors such as open, short and bridging, etc. due to manufacturing defects, and to further debug firmware related error bits besides the defects on solder balls, bumping of the flip-chips, substrates of dice and printed circuit board (PCB), etc.

The boundary scan cells (or test registers) are connected in a dedicated path around the device's boundary or periphery (hence the term "boundary scan captures"). The path creates a virtual access capability that circumvents the normal inputs and outputs, and that provides directional control of the test signals configured as a stream of digitized test data. A boundary scan cell may be a two-state or tri-state register and allows bidirectional signal paths and/or high impedance output.

Chip manufacturers provide BSDL files containing maps of the I/O's and properties of boundary scan cells and linkage bits of their chips. BSDL is a supplement to JTAG standard and is based on VHDL (Very High Speed Integrated Circuit Hardware Description Language), a hardware description language. BSDL files can be used to design and generate test vectors for testing, programing, or otherwise control the devices.

Given the increasingly compact 3D packaging of bare dice in an MCM without KGD, chip manufacturers cannot cost-effectively streamline their MCM manufacturing process in order to validate and guarantee the quality of MCMs. Heretofore, there is no prior art solution to the problem of making reliable MCMs via a novel application of tandem mode testing and debugging, without requiring KGDs in a mass production environment.

SUMMARY OF THE INVENTION

An objective of the present invention is to provide a dependable method and arrangement for boundary scan testing and debugging, in order to eliminate guesswork in making MCMs and to get away from pre-packaging of IC dice.

Another objective is to provide an arrangement for temporarily linking corresponding boundary scan cells of each pair of identical dice of two or more identical MCMs in tandem (or providing a pseudo mirror image of these MCMs in tandem mode) for boundary scan testing, both of which MCMs were manufactured to identical design specifications.

Still another objective is to provide an interface board for serially daisy-chaining a first and a second MCM and for interlinking the corresponding boundary scan cells of corresponding identical dice of the first and the second MCM to facilitate bidirectional transmission of boundary scan test vectors between said corresponding boundary scan cells and between the first MCM to the second MCM with respect to the parallel buses such as data, control and address, etc.

According to one aspect of the present invention, there is provided a multi-layered motherboard for interfacing with the first and second MCMs, and which electrically or conductively connects corresponding boundary scan cells of corresponding identical dice of the first and second MCMs. The motherboard preferably has a switch for enabling boundary scan test vectors to drive or sense a single MCM or the paired MCMs.

According to another aspect, the boundary scan test vectors are configured to debug the infrastructure of the daisy-chained first and second MCMs using TDI and TDO of the respective MCMs in a forward and then a reverse direction, to check initial conditions of the chained dice.

Further boundary scan test vectors are configured for transmission between interlinked corresponding boundary scan cells of the first and second MCMs to determine the integrity of the circuitry via their two combined net-lists including the bumping, substrate, dice, traces, and soldering pads, etc. at each of the MCM associated pins and nets.

According to still another aspect, each of the first and second interconnected MCMs is used for boundary scan testing the other MCM, and vice versa, to determine a variance based on the boundary scan test diagnostics of both MCMs in the form of a unified truth table or chart, with data representing two combined net-lists of the MCMs and preferably include columns representing analytical results of test vectors from two or more cells driving "high" and "low" to sense each other's responses in "1" and "0". The unified truth table presents the interconnection test output from iterations of boundary scan test vectors between the boundary scan cells of the interlinked MCMs until an equilibrium condition is reached. However, a self-test using test vectors generated by its own boundary scan chain is insufficient to detect flaws in the MCM because the MCM is made with unknown dice. In a mutual test where the boundary scan cells of two identical MCMs (MCM-X and MCM-Y) under test are interlinked through a motherboard according to the present invention, variances between these two MCMs can be readily detected. Since each MCM has identical sets of net lists and boundary scan daisy chains, the net lists of both MCMs are interconnected through the motherboard to perform mutual test in order to check their mirrored images on their cloned or corresponding dice.

According to yet another aspect, the inventive method uses boundary scan daisy chains of two combined strands of boundary scan cells in relation to corresponding dice of interlinked MCMs. Each strand is coupled via a switch on the motherboard of the twin MCMs through a web-like circuitry on which the first and second MCMs are interconnected. Test vectors transmitted between these two strands generate a unified or combined truth table showing corresponding charts of the two MCMs' data stream, to map out the actual and imaginary part of the test data. If one of two MCMs has defectives, this combined truth table will show a variance in the data patterns, i.e., error bits indicating a defect in a specific netlist of a certain die associated with the defective MCM, such as open, short, grounding, and power outage, bridging, etc.

The mutual test uses a matrix technique to detect the error bits, wherein its test vectors are transmitted uni-directionally and/or bi-directionally between corresponding boundary scan cells of the linked MCMs in an iterative manner. In a self-test, the test vectors are transmitted in 1's and 0's through the linked dice within a single MCM as opposed to the mutual-test wherein the test vectors are transmitted between these two paired MCMs to show mismatched test patterns, if any. According to one embodiment of the present invention, there is provided a method of debugging MCMs made without KGDs, comprising the steps of:

(a) Conductively connecting corresponding boundary scan cells of corresponding identical dice of a first and a second MCM and daisy chaining the first and second MCMs, the first and the second MCMs being identically designed, and daisy chaining the boundary scan cells of the dice of the first and the second MCMs in tandem and interconnecting buses between the second MCM and the first MCM in a parallel arrangement;

(b) Boundary scan testing the first and then the second MCMs by transmitting test vectors serially from the first MCM to the second MCM;

(c) Boundary scan testing each of the corresponding dice in the first and second MCMs by transmitting test vectors between corresponding boundary scan cells of the corresponding identical dice back and forth;

(d) Generating and combining truth tables from Steps (b) and (c) showing boundary scan test results of the first and the second MCMs in a matrix; and (e) Determining manufacturing defects in the first and second MCMs from the combined truth tables, which combine the output data stream of the first and second MCMs, by identifying a variance in the output data stream of the first and/or second MCMs through boundary scan diagnostic techniques.

According to another preferred embodiment, there is provided an arrangement for trouble-shooting manufacturing defects of MCMs made without KGDs, comprising:

(a) A web-like circuit board (i.e. motherboard) having conduits configured to conductively connect corresponding boundary scan cells of a first and a second MCM having identical dice and to daisy chain the boundary scan cells of the first and second MCMs;

(b) Means for generating test vectors for the first and second MCMs in tandem;

(c) Means for transmitting test vectors serially across the boundary scan cells from the first to the second MCMs and vice versa to perform infrastructural tests;

(d) Means for transmitting test vectors between boundary scan cells of corresponding dice of the first and second MCMs through an associated bus to conduct interconnection tests and diagnose tests vectors between the first and second MCMs;

(e) Means for generating one or more truth tables showing test results from (c) and (d) for the first and second MCMs across the web-like circuit board;

(f) Means for determining manufacturing defects in the first and second MCMs by identifying a variance in the truth tables contrasting the boundary scan cells of the identical dice of the first and second MCMs;

(g) Means for switching between self and mutual tests of the first and second MCMs by selectively connecting and disconnecting the first MCM from the second MCM in order to determine which of the MCMs is defect free.

The present invention provides a reliable method and arrangement for boundary scan testing and debugging newly manufactured multi-chip modules (MCMs) made to identical design specifications with no KGDs therein. Advantageously, a first and a second MCM are temporarily linked in tandem for boundary scan testing by a motherboard serially daisy-chaining their internal dice, and interlinking the corresponding boundary scan cells of the first and second MCM to approach parallel buses, assisted by a switch on the motherboard, to (1) run self-test or mutual test through bidirectional chain reactions in order to generate an extended Truth Table that includes an array of combined netlist, and (2) to map out test vectors as "1" and "0" in response of High and Low per Drive and Sense, to thereby diagnose mismatched bits according to the preset test patterns. Any disagreement between the first MCM and the second MCM on the Truth Table would indicate error bits occurred at their linked nets. Further failure analysis provides an opportunity for trouble-shooting bad dice, and to solve many faults ranging from nets, pins to the substrate, which may be reworked by, e.g., a reflowing process to solve problems related to Known Bad Die at certain interconnections in especially the flip chips depending on issues concerning bumping, soldering pads, etc. due to cold or hot soldering. Further inventive method includes applying analog and digital methods to avoid misjudgment on or misdiagnosis of good dice if mixed boundary scan cells include a number of linkage bits in one pin of a particular die. This inventive method could distinguish some pins for boundary scan from the other pins designed for functional test to thereby determine and conclude that a newly made module is a Known Good Module (KGM) without KGD. This KGM can then be used to create additional KGMs from other unknown Modules in accordance with the present invention.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings:

FIGS. 11A, 11B, and 11C show third-party trouble-shooting and diagnostic tools running, respectively, 1) an Infrastructure Test that generated a sequence report, 2) an Interconnection Test that generated a Truth Table Report (TTR), and 3) Diagnostics of the TTR using Boundary Scan Diagnostics (BSD); FIGS. 11D and 11E depict screenshots of generation of Truth Table Results (TTR) showing results from a boundary scan test of the paired or twin MCMs in FIGS. 8, 9, and 10;

FIG. 13 illustrates Truth Table Results (TTR) displaying the manufacturing defects in one of the MCMs diagnosed as having shorted nets along with related cells in accordance with the present invention;

FIG. 15 illustrates yet another TTR displaying manufacturing defects in both of the MCMs diagnosed as having "open" nets related cells in accordance with the present invention;

FIG. 17 illustrates a TTR showing both MCMs having error cells due to bridging nets in related dice in accordance with the present invention;

FIG. 18 illustrates a BSD showing both MCMs having error cells in related dice in accordance with the TTR in FIG. 16;

FIG. 19 illustrates reworked dice of both MCMs which passed the mutual test in accordance with the present invention;

FIG. 20 illustrates an exception of an exemplary BSDL file showing mixed boundary scan cells and linkage bits in the same die;

FIG. 21 illustrates an example when MCMs are configured as a Host or Peripheral terminal such that the boundary scan cells and linkage bits require a 2×2 matrix like test strategy;

FIG. 22 illustrates the example in FIG. 21 of boundary scan test "fail" when the boundary scan cells of MCM-Y behave as a Peripheral terminal;

DETAILED DESCRIPTION OF THE PRESENTLY PREFERRED EMBODIMENTS

Figure 1:
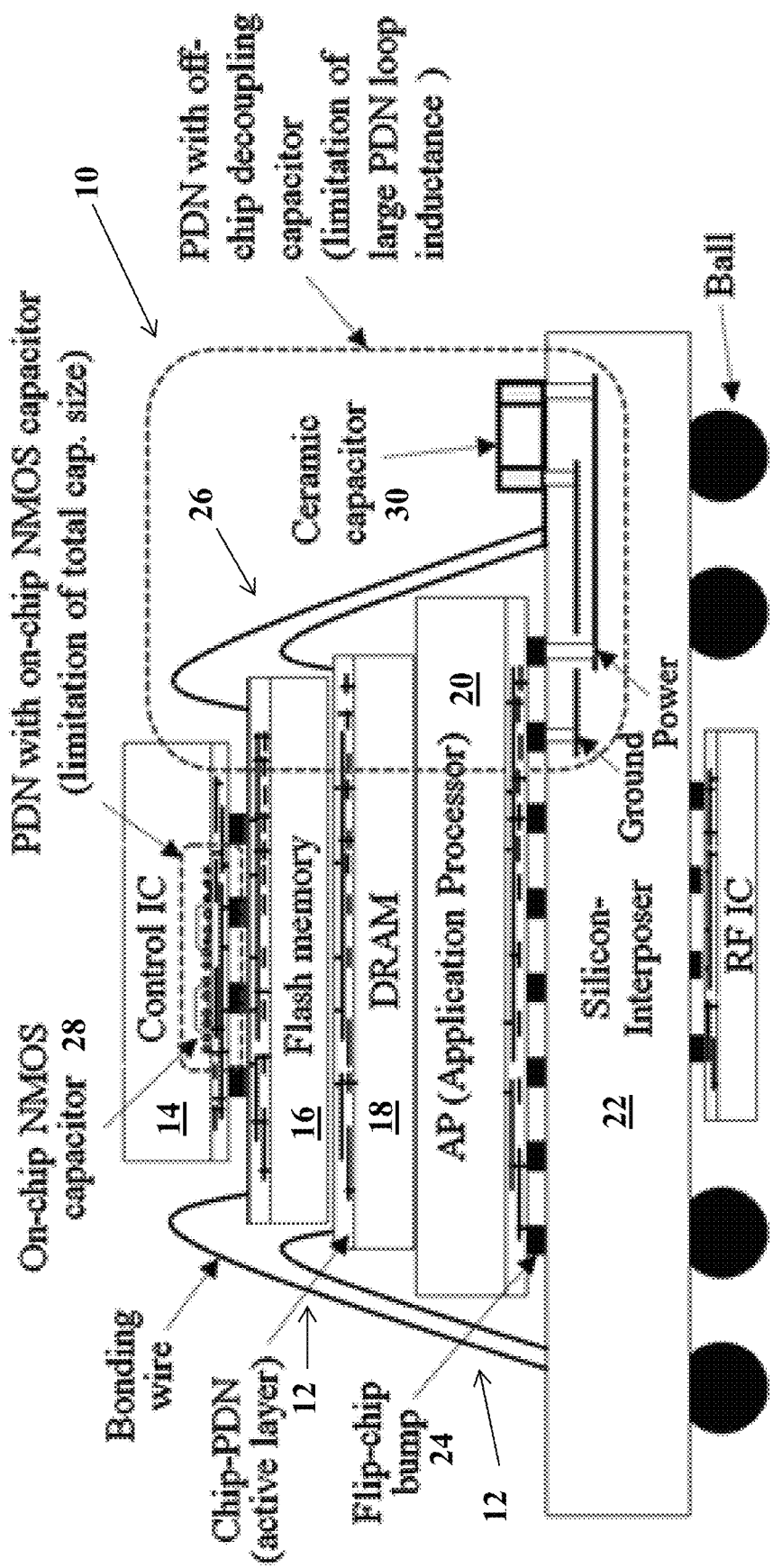
FIG. 1 depicts a representative multi-chip module (prior art)

FIG. 1 shows an exemplary 3D architecture of a multi-chip module (MCM) 10 having a plurality of dice 12 stacked atop each other: a control integrated circuit (IC) 14, a Flash memory 16, a dynamic random-access memory (DRAM)

18, and an Application Processor (AP) 20, all of which sit atop a silicon interposer 22 via flip-chip bumping 24. Wire bonding 26 may be used to selectively connect these dice and discrete components such as, for example, N-type metal-oxide-semiconductor (NMOS) 28 or ceramic capacitors 30. The 3D architecture design also contemplates stacked dice and/or stacked memories selectively placed across and interconnected to each other through the silicon interposer for signal communications as well as grounding and power. This entire assembly may be flip-chip mounted onto a package substrate, preferably made of polyimide having a high dielectric constant, and housed in a suitable package (which may be referred to as a Ball Grid Array (BGA) package). Designers of System-in-Package (SiP) or System-on-Chip (SoC) may employ this 3D architecture to achieve the desired optimization of processing and calculation objectives, i.e., through the use of a high number of core processors.

The MCMs made with 3D stacked chips and components are complex and difficult to manufacture with reliability. Even if KGDs (Known Good Die) are used, a manufacturer cannot determine whether any of the interconnections (e.g., solder bumps and flip-chips) through the substrates or silicon interposers for interconnecting the 3D stack dice and components are defect-free. In order to debug errors in the manufacturing that gives rise to defective MCMs, the present invention advantageously provides an arrangement and method for debugging MCMs made without KGDs through an innovative application of boundary scan tests in tandem mode.

Figure 2:
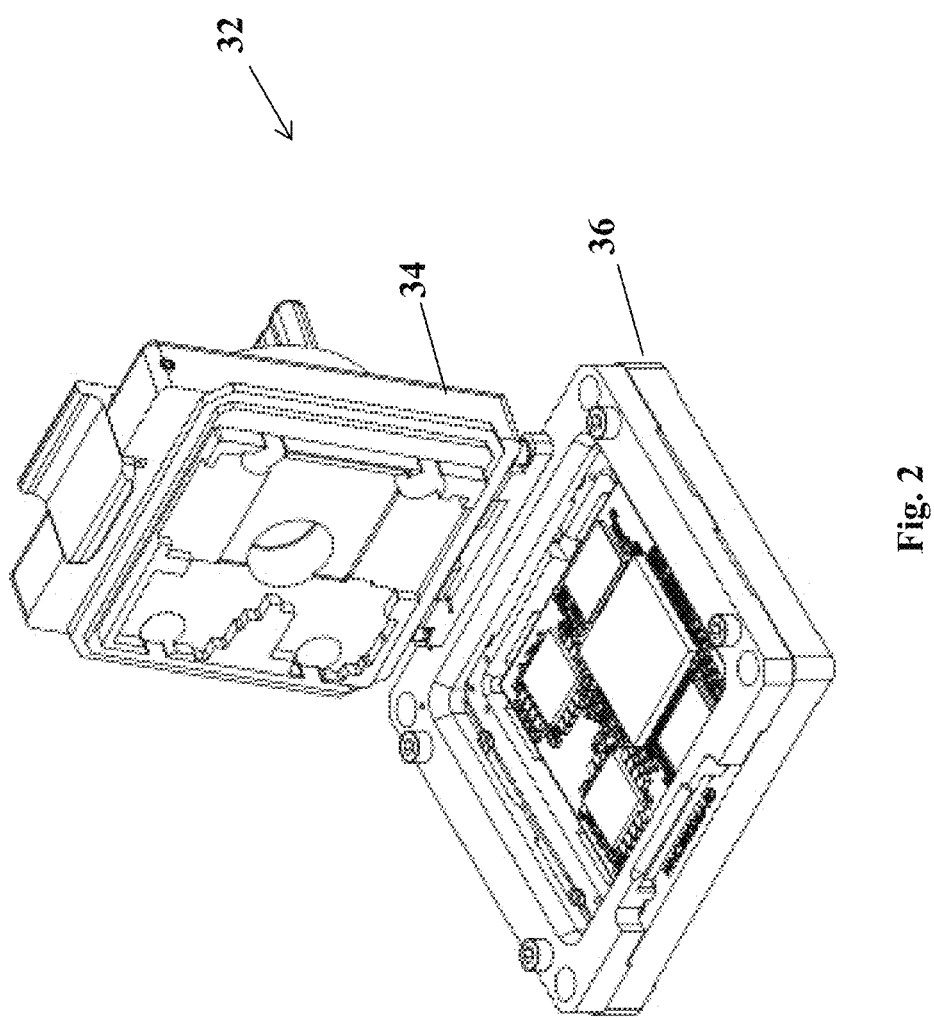
FIG. 2 depicts a MCM with the top uncovered (prior art)

As shown in FIG. 2, there is provided an MCM debug housing 32 comprising a protective cover 34 and a base unit 36 for holding and interconnecting an MCM with a conduit-like motherboard (not shown).

Figure 3:
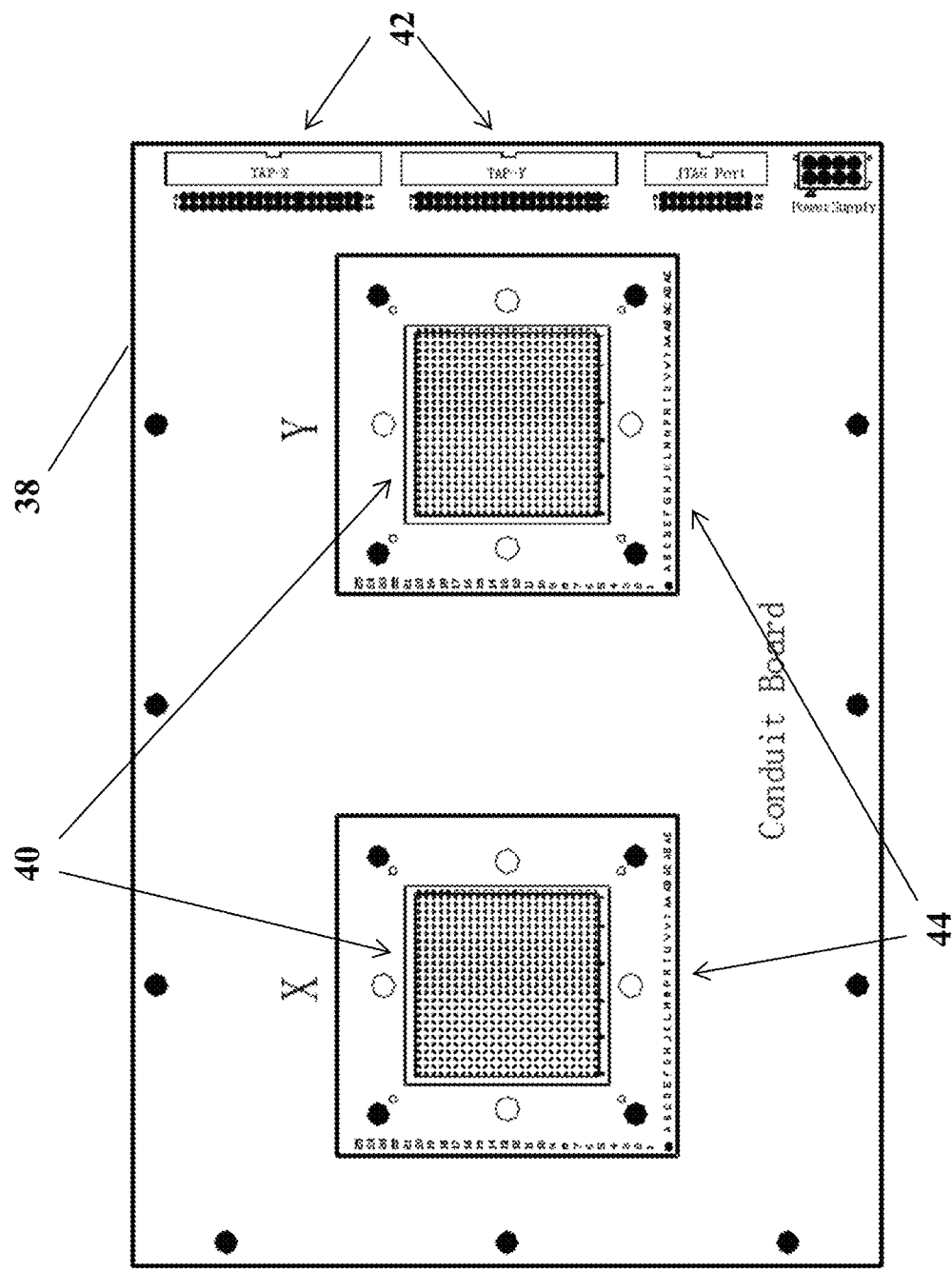
FIG. 3 schematically illustrates two MCMs interconnected through a printed circuit board, mounted with JTAG connectors.

FIG. 3 schematically depicts a layout of a presently preferred embodiment of a motherboard 38 which is preferably a multilayered printed circuit board. As illustrated, the motherboard includes sockets 40 for receiving I/O pins, power and grounding pins to and from two MCMs plus the required IEEE-1149.1 JTAG ports which are the TAP connectors 42. There are also provided attachment location points 44 for receiving fasteners from the MCM socket housings 32 for aligned and forcible engagement of the contact pins from the MCMs themselves.

Figure 4:
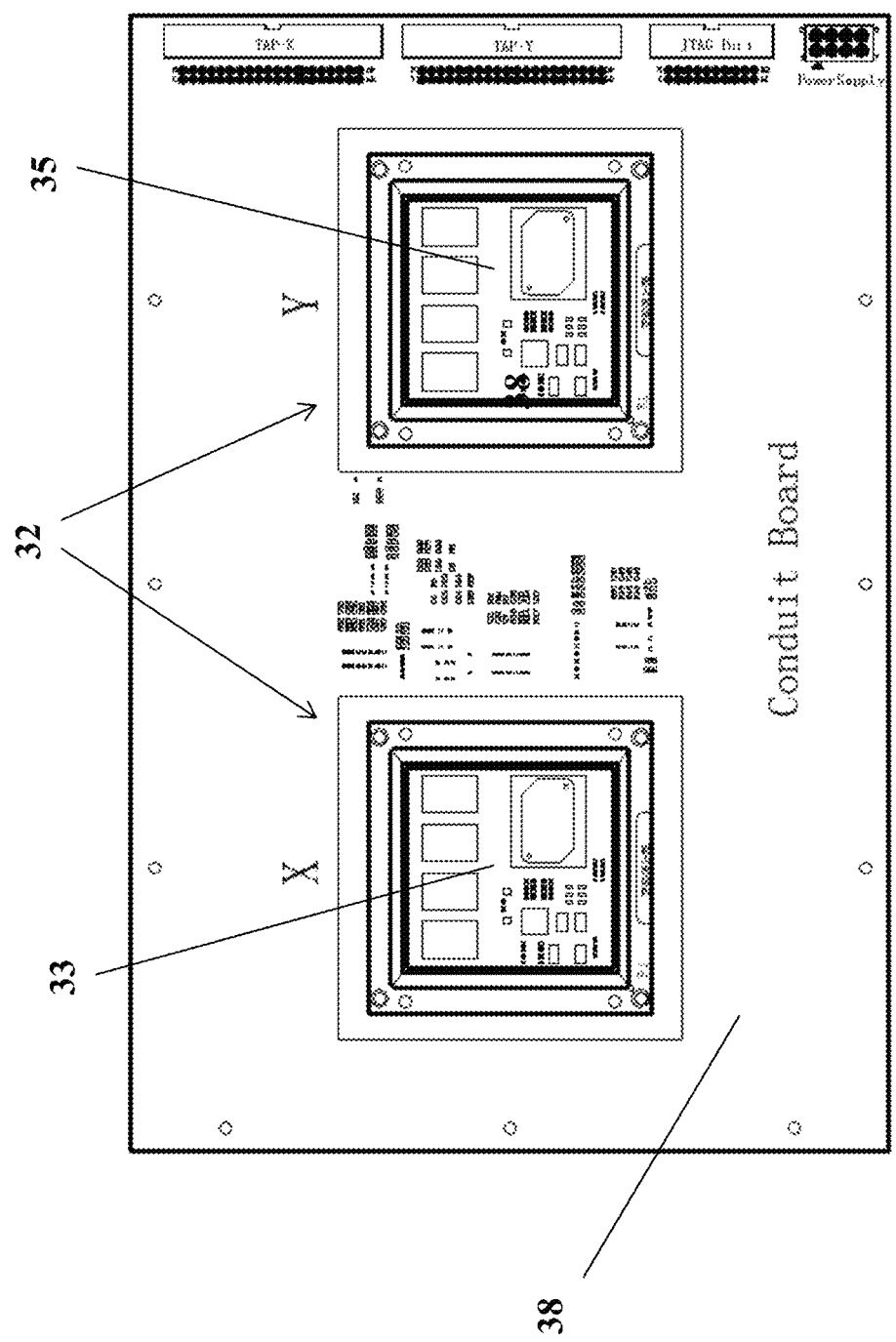
FIG. 4 is a photo showing two identical MCMs operatively connected to each other through a printed circuit board based platform.

FIG. 4 depicts two identically designed MCMs, i.e., MCM-X 33 and MCM-Y 35 with their respective socket housings 32 fastened onto the conduit-like motherboard 38, and which are configured for boundary scan testing in accordance with the present invention. As shown, the conduit-like motherboard 38 is a multilayered printed circuit board which includes a TAP Access connector 42 for connection with an off-board TAP control device or boundary scan controller. To run the required boundary scan test protocols, there is provided a computer which controls and commands the boundary scan controller to dialog with the two MCMs 33 in execution of prewritten test programs for tests such as, for example, infrastructure tests to validate the daisy chained boundary scan cells, and interconnection tests to validate their busing structures, to detect any defects or errors in the MCMs and/or In-System-Programming (ISP) memory chips. In addition, the boundary scan controller may also check the first and second MCMs' specified test clock (TCK) frequencies to determine whether the first and second MCMs are out of synchronization in accordance with the BSDL advised test clock frequencies (i.e., the test clock (TCK) information described in their BSDL files).

Figure 5:
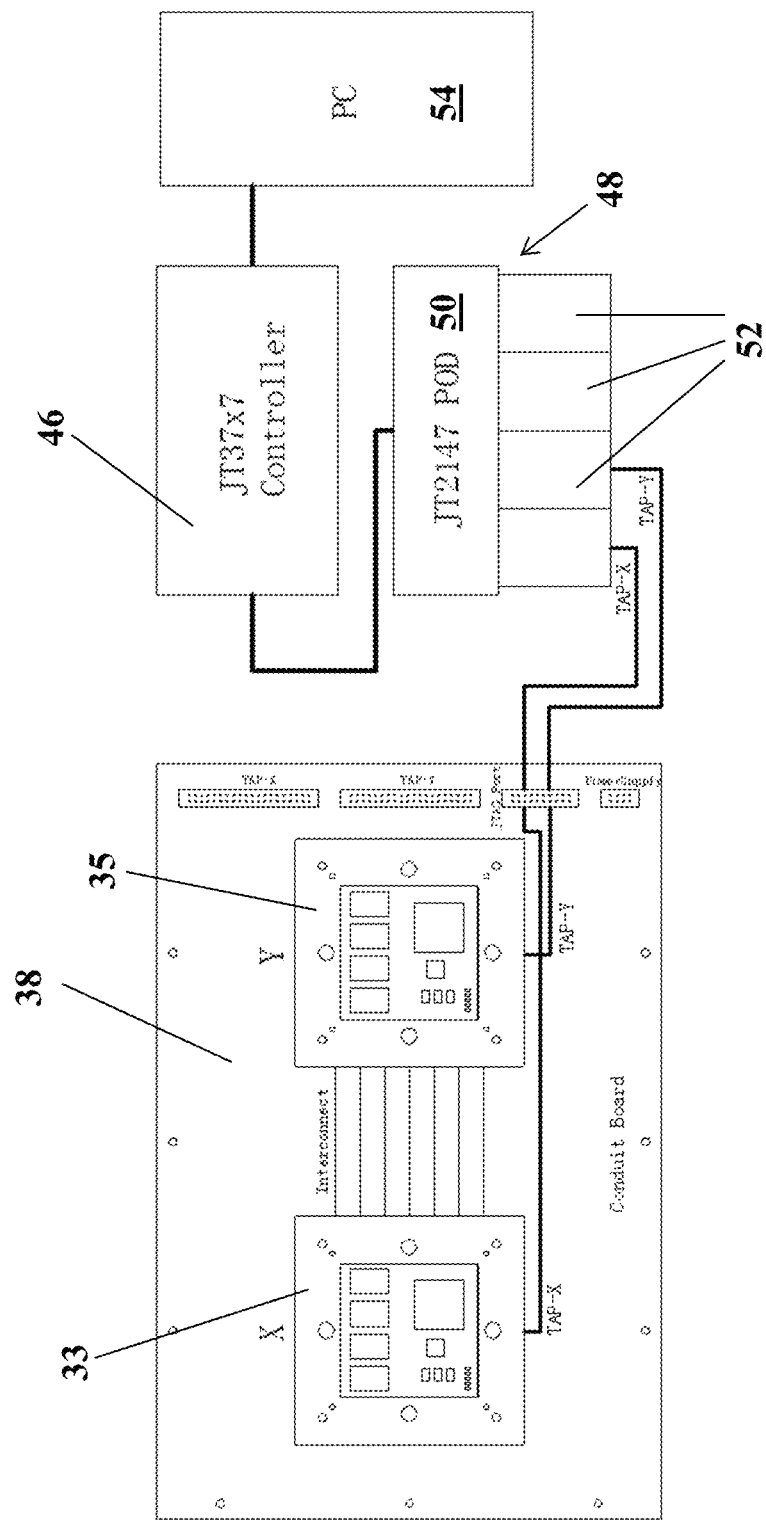
FIG. 5 depicts a mockup of an embodiment of the inventive MCM debugging arrangement.

FIG. 5 illustrates an exemplary test platform in accordance with the present invention, comprising: 1) the motherboard 38 and the identically designed MCMs (or "twin-MCMs") (i.e., MCM-X 33 and MCM-Y 35) under test, 2) JTAG Boundary Scan Controller 46 (e.g., JT 2137×7), an off-board TAP control equipment, 3) a JTAG programmer 48 (e.g., JT-2147 QuadPod) including a transceiver 50 (e.g., JT-2148) and four programmable TAP Pods 52 (e.g., JT-2149) connecting the JTAG Boundary Scan Controller 46 and the MCMs 33, 35 under test through the conduit-like motherboard 38, and 4) Personal Computer 54 to run Infrastructure, interconnect, boundary scan diagnostics pursuant to a three-part test program. The TAP Pods 52 allow multiple daisy-chain communication in parallel and synchronized to a specific timing diagram, with the MCMs 33, 35 either under self-test or mutual test modes.

Figures 6, 7:
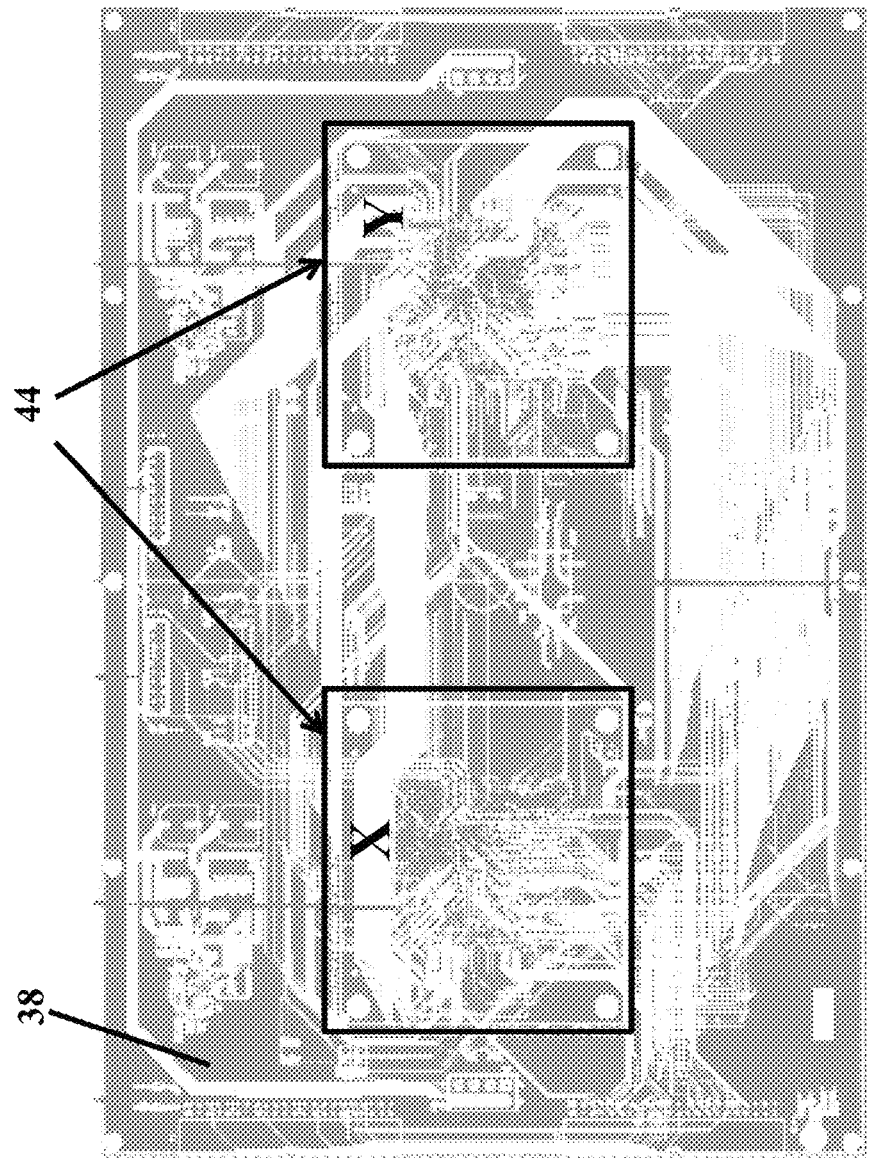
FIG. 6 illustrates the conductive paths or interconnections in the printed circuit board for conductively connecting two MCMs.
FIG. 7 shows several sample boundary scan test vectors for diagnostic purpose.

FIG. 6 depicts the conductive pathways in the conduit-like debugging circuit board 38 for connecting or linking the boundary scan cells of the identically designed MCMs 33 in the MCM debugging housings 32 fastened to the conduit-like debugging circuit board 38 via the mounting points 44. The conductive pathways are routed through a switch (not shown) in the circuit board 38 for selectively facilitating transmission of signals to a single MCM or serially through the two MCMs in tandem. Advantageously, the conduit-like motherboard 38 is configured to link the corresponding boundary scan cells and TAP controllers of each of the corresponding JTAG-compliant devices or dices (e.g., those devices or dices having identical functions/features) in the two identically designed MCMs through an associated bus for direct operative communication between said corresponding boundary scan cells and for daisy-chaining the boundary scan cells of the two MCMs in tandem. The motherboard 38 permits boundary scan test vectors to be transmitted (1) serially through the TDI and TDO of each die of each MCM and (2) among corresponding boundary scan cells of corresponding identical dice of the two identically designed MCMs in parallel (via a bus in the motherboard), whether under self-test or mutual-test. As shown, the boundary scan cells of the MCMs under test are connected in a multi-layered motherboard 38 resembling a neural network.

By transmitting boundary scan test vectors through the TDI of each die and then outputted through the TDO of each die of an MCM (i.e., to form a scan chain or daisy chain), one can determine the faults and defects in the infrastructure tests of each MCM (e.g., whether all dice and components along the boundary scan chain are properly connected). By enabling the switch on the conduit-like motherboard 38 to allow the boundary scan vectors to continually pass through a first MCM and then a second MCM, and vice versa, in a repetitive manner, each MCM becomes a driver or a receiver of each other's input test vectors, and the boundary scan test results will produce a matrix of database that tabulates the first and second MCM's responses to the test vectors.

After the infrastructure test, boundary scan vectors are directed for transmission between corresponding boundary scan cells of corresponding dice of the first and second MCMs to examine the integrity of the interconnections in each MCM, including the data bus, control bus, and address bus (i.e. an interconnection test). Test chain may be designed for testing the buses of each die by selectively bypassing other dice. These boundary scan test vectors, as they are repetitively and reciprocally or reversibly transmitted between the corresponding dice of the first and second MCMs, will reveal defects in the net-lists of the buses (e.g., components, bus, and substrate) of each MCM when test patterns are violated.

FIG. 7 illustrates a sample set of boundary scan test vectors, with each vector containing 8 bits, in a Serial Vector Format for transmission through an MCM. In an exemplary use scenario, the set of test vectors (No. 1 through 8) is inputted serially into the TDI, through the boundary scan cells of a JTAG compliant device, and then the resulting vectors are outputted through the TDO. The resulting vectors are then compared to the expected response, which may be provided by the MCM and/or IC manufacturer in the form of Boundary Scan Description Language (BSDL) files.

Figure 8:
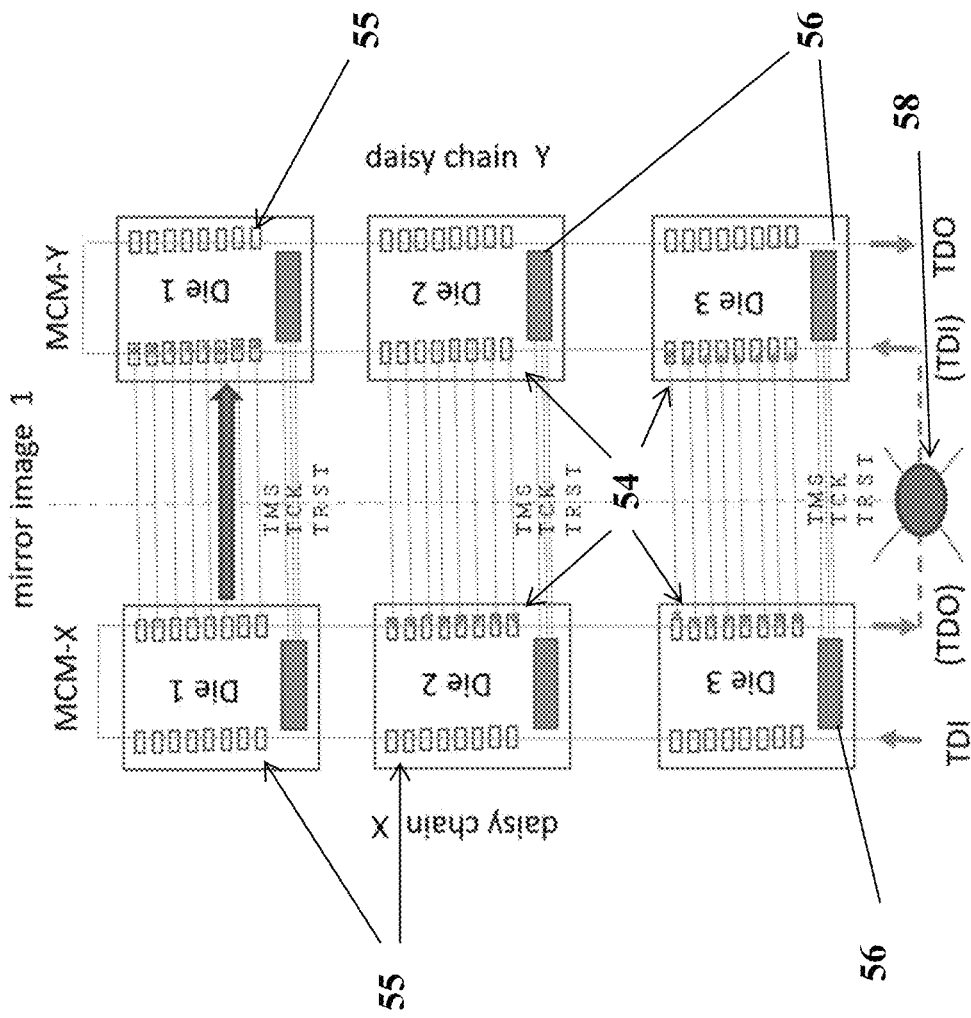
FIG. 8 diagrammatically depicts interconnections and daisy-chaining of corresponding boundary scan cells of corresponding dice of two MCMs built to identical specifications, switching between corresponding dice of the two MCMs to test for shorts.

FIG. 8 diagrammatically depicts corresponding dice (i.e., Die 1, Die 2, and Die 3) of a first MCM (identified as "MCM-X") and a second MCM (identified as "MCM-Y"), each MCM having boundary scan cells 55 at the input and output pads of each die, and a TAP controller 56 for each die. TAP controllers 56 of the corresponding dice are also shown to be in operative communication via TMS, TCK, and TRST. A switch 58 on motherboard 38 is operationally connected between the MCM-X and MCM-Y to allow a user to switch On/Off conductive path(s) therebetween such that a boundary scan can be performed on a single MCM or both, in a forward or reverse direction. As shown, the corresponding boundary scan cells are linked serially (i.e., daisy chained) from the TDI of MCM-X to the TDO of MCM-Y (i.e., through the conduit-like motherboard 38). Additionally, each boundary scan cell of a die of MCM-X is linked directly with a corresponding boundary scan cell of a corresponding identical die of MCM-Y in their mirror images. Each TAP controller manipulates an instruction register (IR) of each die of MCM-X, which is linked directly with those of a corresponding die of MCM-Y through its TAP signal lines while TMS, TCK, and TRST are in parallel between these two paired MCMs. As configured, when a mutual test is performed (i.e., with the switch 58 in the CLOSED position) selective test vectors may be inputted into the TDI of MCM-X and outputted through the TDO of MCM-Y, and vice versa, i.e. from the TDI of MCM-Y to the TDO of MCM-X, to purposefully debug defects in the interconnections of the MCM-X and MCM-Y, as would be shown evidently on Truth Table Results (TTR). A self-test of each MCM-X and MCM-Y may be performed with the switch in the OPEN position.

Figure 9:
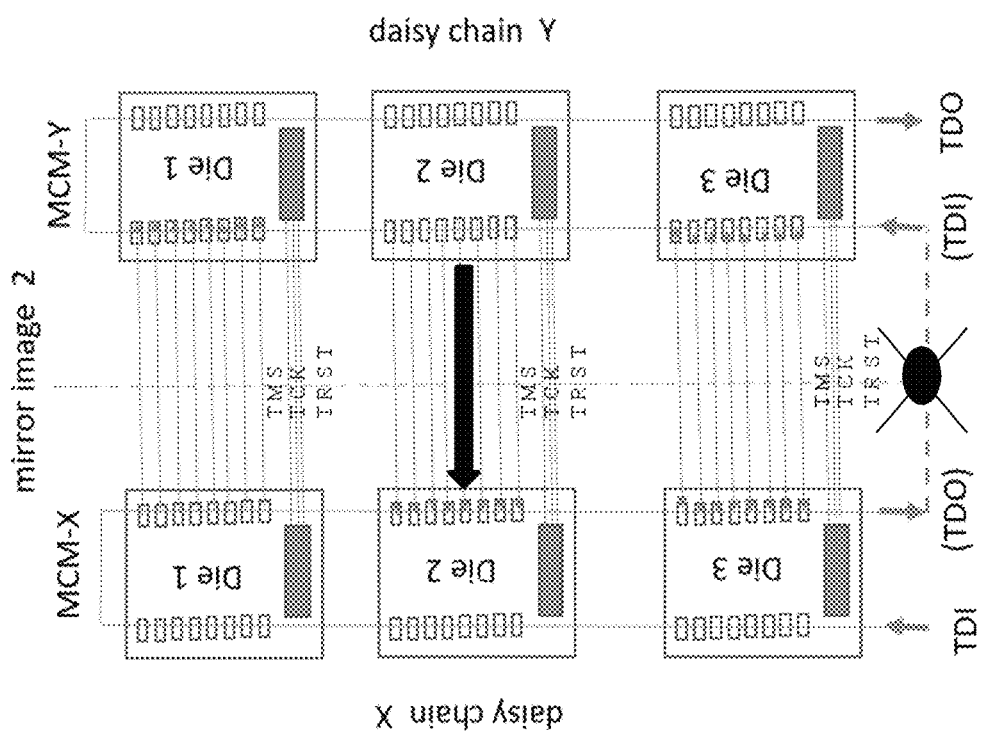
FIG. 9 diagrammatically depicts interconnections and daisy-chaining of corresponding boundary scan cells of corresponding dice of two MCMs built to identical specifications, switching between the corresponding dice of the two MCMs to test for open circuit(s)
Figure 10:
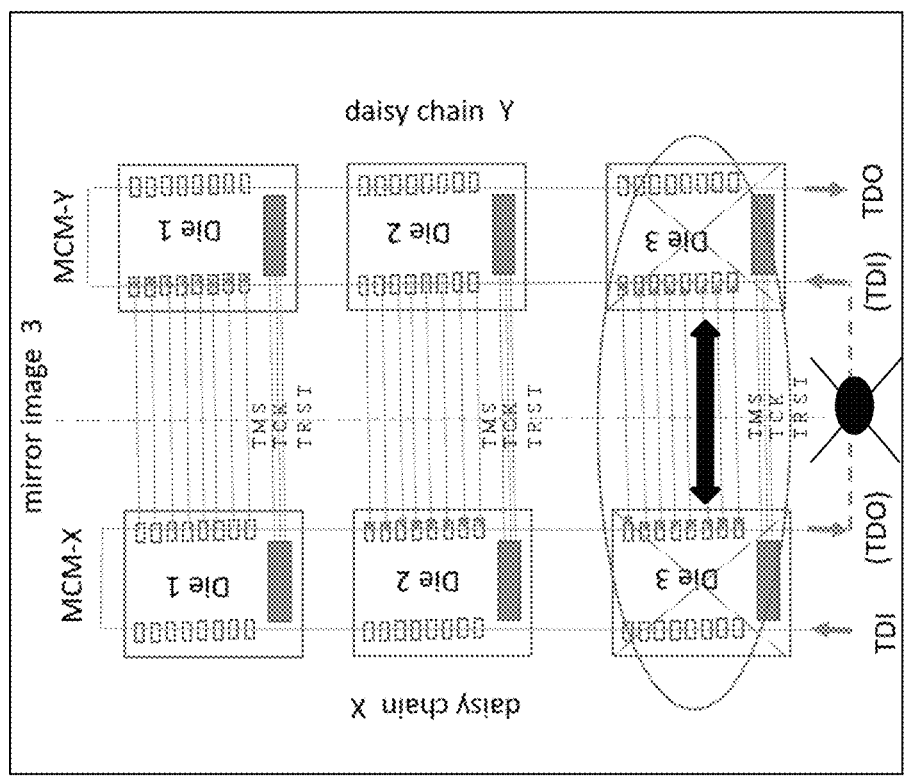
FIG. 10 diagrammatically depicts interconnections and daisy-chaining of corresponding boundary scan cells of corresponding dice of two MCMs built to identical specifications, switching between the corresponding dice to test for "Short"

FIGS. 8, 9 and 10 show a directional buss configured as unidirectional or bidirectional during a mutual-test, to allow specific test scenarios such as Short, Open, or Bridging, when performing an interconnection test among matched or corresponding dice. Specifically, FIG. 8 shows a unidirectional mutual-test for Short; FIG. 9 depicts a unidirectional mutual-test for Open; and FIG. 10 illustrates a bidirectional mutual-test for Bridging.

Figure 11C:
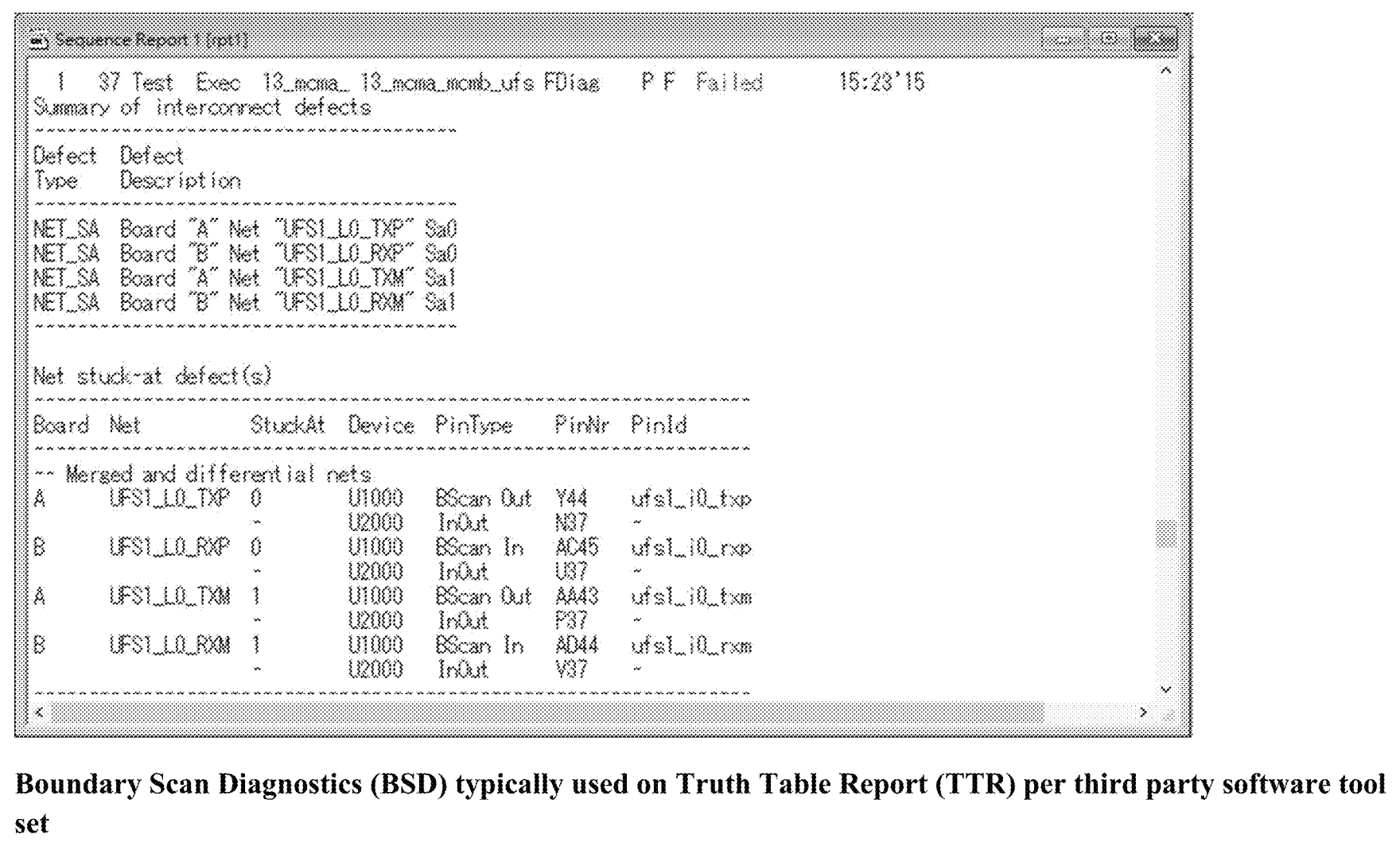
Figure 11D:
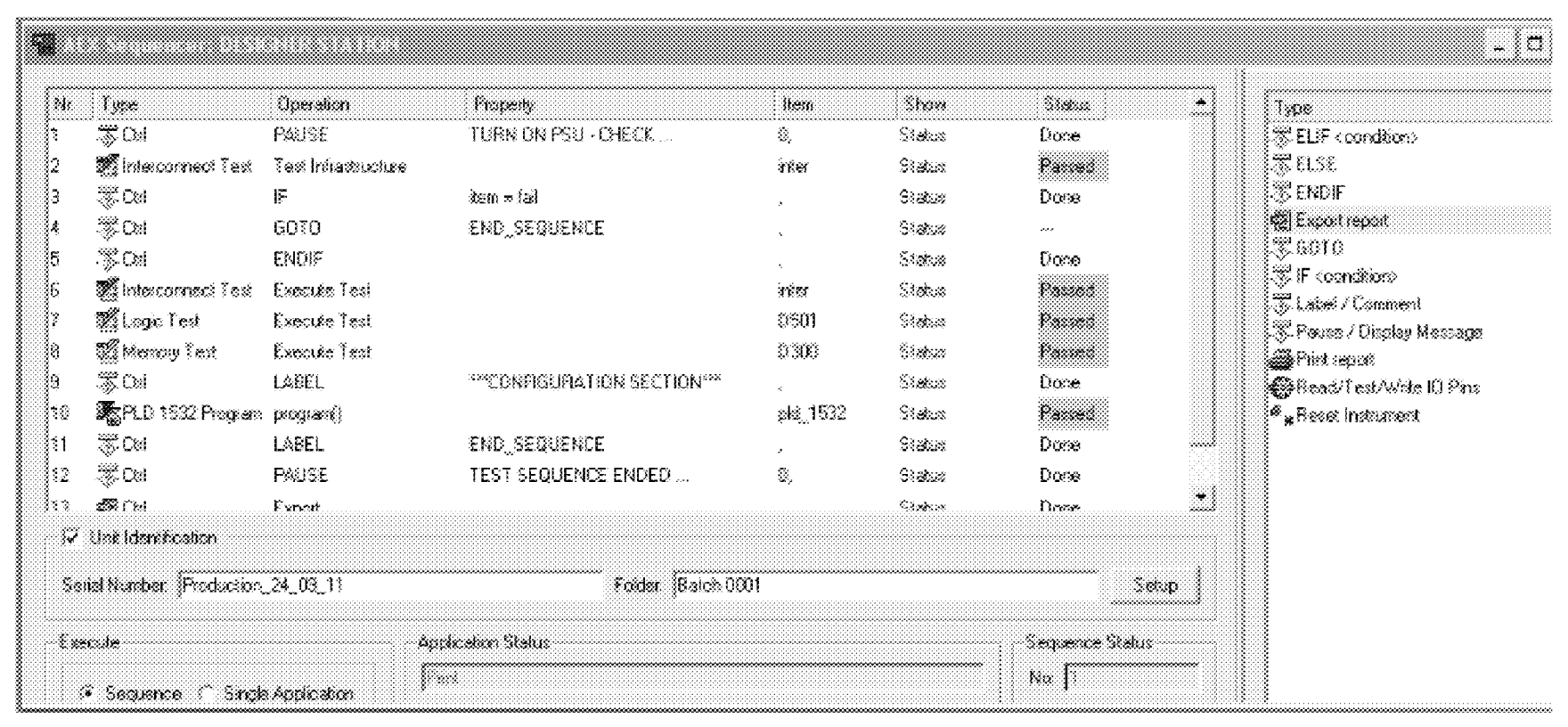
Figure 11E:
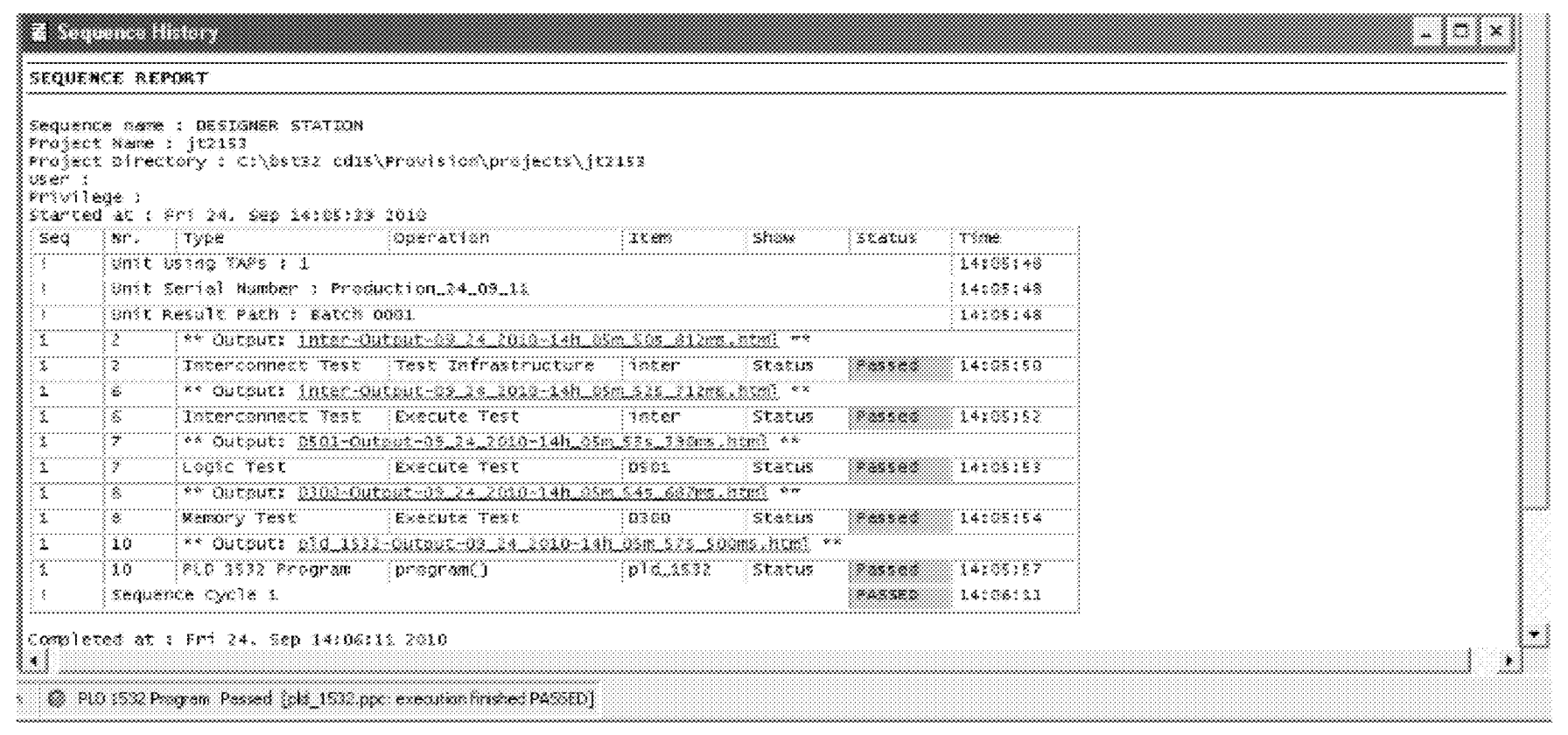

FIGS. 11A, 11B, and 11C show screen shots of third-party Boundary Scan test software running, respectively, 1) an Infrastructure Test that generated a sequence report, 2) an Interconnection Test that generated a Truth Table Report (TTR), and 3) Diagnostics of the TTR using Boundary Scan Diagnostics (BSD) software that generated a report identifying error bits due to possible short, open and/or bridging nets in relation to their corresponding dice, which tool set could generate a test-required data package such as netlists, BSDL files and test vectors, etc. FIGS. 11D and 11E depict screenshots of a generation of Truth Table Results (TTR) showing results from a boundary scan test of the paired or twin MCMs in FIGS. 8, 9, and 10, which are generically identified as MCM-X and MCM-Y. The rows of the truth table represent test vector responses from different net-lists (listed by columns) of the two MCMs. The responses are grouped under each MCM, notably the MCM-X initially passed a standalone boundary scan test, i.e. a "self-test". However, when MCM-Y is tested and analyzed in tandem mode against MCM-X, flaws occur in their interconnectivity, in accordance with the "mutual test". The resulting combined truth table shows that MCM-Y has a number of shorts (i.e., shorted to GND, POWER), as indicated by 0's, in light of its net-lists. Thus, the present method advantageously reveals defects in an MCM that would not have been identified by a stand-alone boundary scan test.

Figure 12:
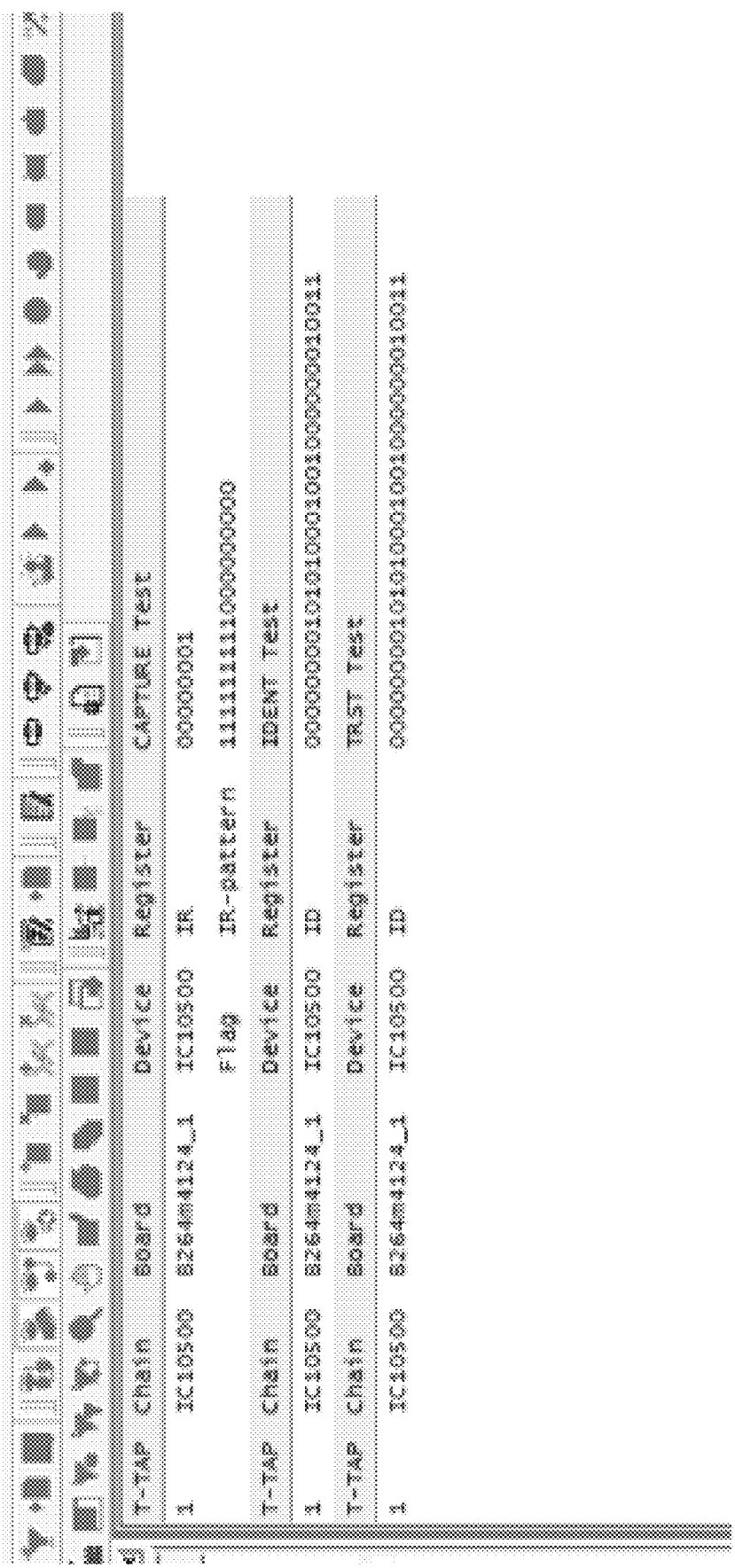
FIG. 12 shows the initial test which is the Infrastructure Test to run on the daisy-chained Die-1, 2, 3 from MCM-X to MCM-Y in preparation to run Interconnection Tests on the two MCMs.

FIG. 12 is a screenshot of test software showing Die 1, 2, 3 of MCM-X and MCM-Y under Infrastructure Test. In particular, these dice are daisy chained to three or more TAP ports, to allow them serially linked to perform a self-test or switched/jumped to run a mutual-test, depending on the switch 58 on the motherboard for steering or routing the test paths either through one or two TAPs under self-test or mutual-test.

FIG. 13 shows a screen shot of a Truth Table Report (TTR) on the configuration in FIG. 8, in which Die 1X of MCM-X passed self-test, but Die 1Y of MCM-Y failed at interconnection test due to possible shorted nets on VCC (power), as reflected on the nets (shown inside shaded boxes) in the TTR.

Figure 14:
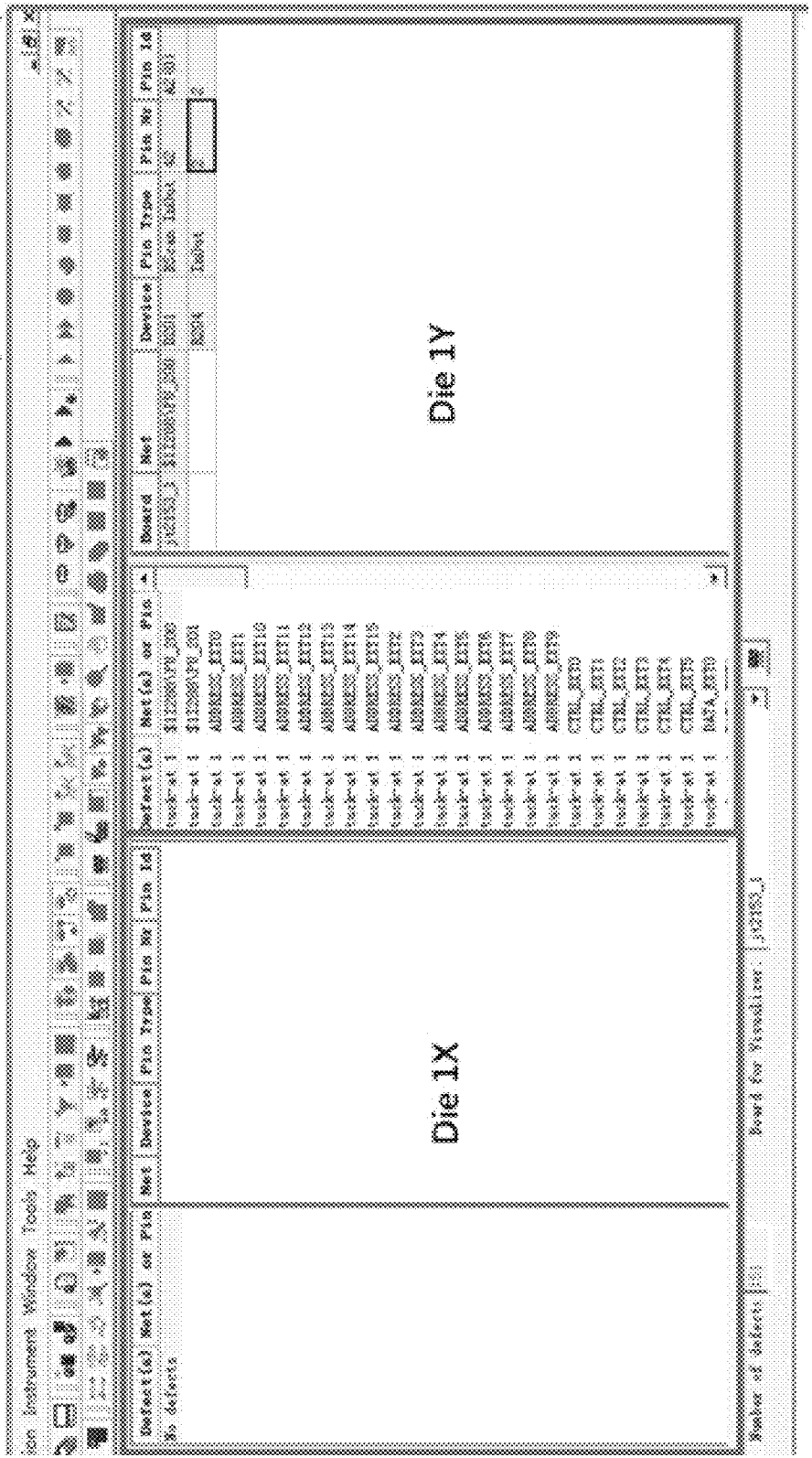
FIG. 14 illustrates a Boundary Scan Diagnostic (BSD) results showing error cells related die in accordance with the TTR in FIG. 12.

FIG. 14 shows a screenshot of an output of a Boundary Scan Diagnostic (BSD) software for analyzing the TTR of FIG. 13 with reference to the MCM-X/MCM-Y configuration in FIG. 8 as part of the trouble-shooting process for identifying errors that are taking place at the die associated pin and net in order to trace back the affected cells in BSDL. As shown, the BSD determined that Die-1Y's associated pins and nets are shorted to VCC (power).

FIG. 15 shows a screen shot of a TTR based on the configuration in FIG. 9, in which the Die 2X of MCM-X and Die 2Y of MCM-Y failed the self-test due to an open net which is marked or shaded to identify its associated boundary scan cells.

Figure 16:
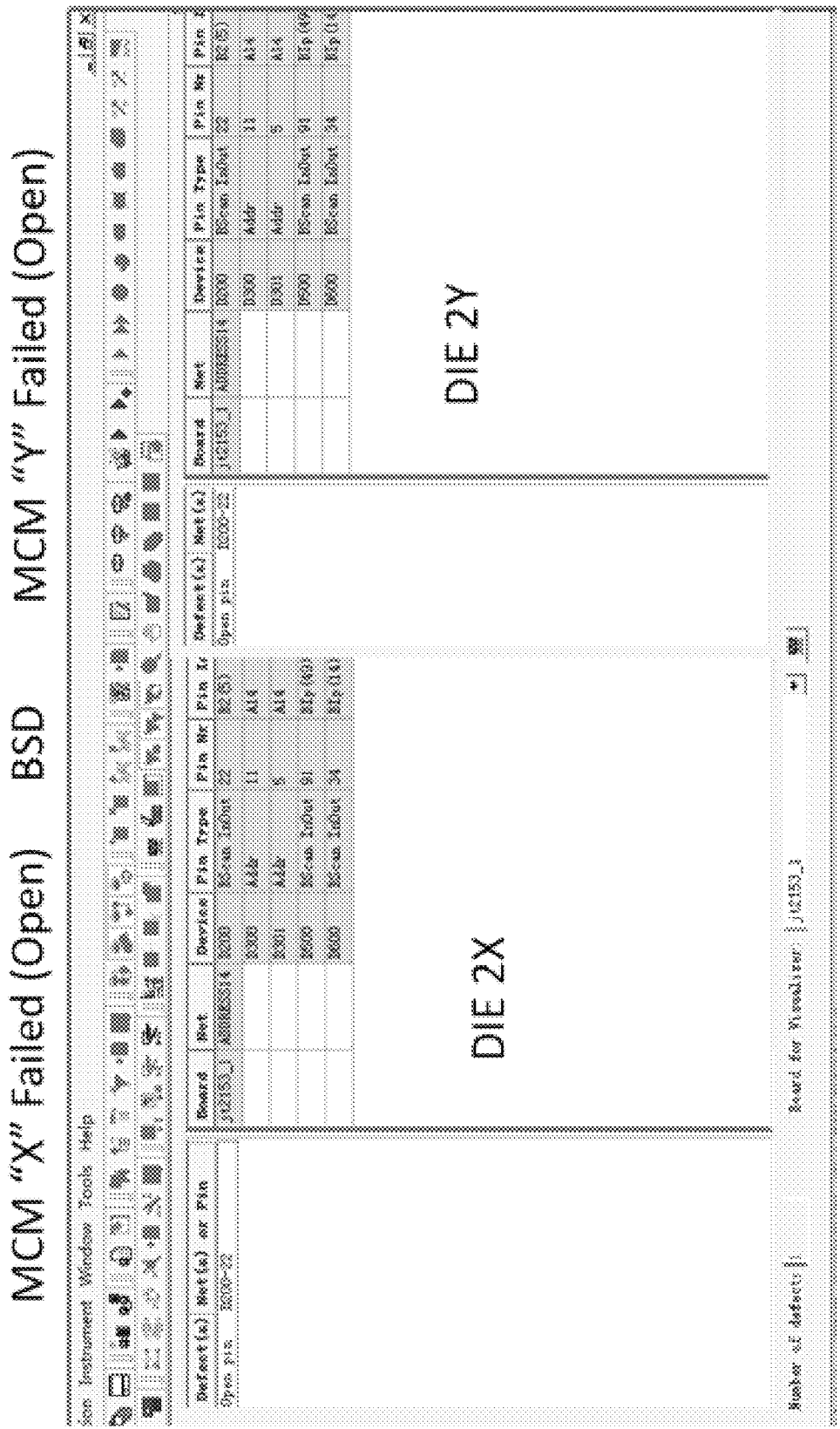
FIG. 16 illustrates a BSD showing both MCMs having error cells in related dice in accordance with the TTR in FIG. 14.

FIG. 16 shows the BSD in reference to the configuration in FIG. 9 as a result of the TTR in FIG. 15, identified errors (e.g., open net) at Die 2X and Die 2Y and its associated pins and nets, so as to allow trouble-shooting bad cells listed in BSDL.

FIG. 17 shows a screen shot of TTR based on the configuration in FIG. 10, in which both Die 3X and Die 3Y fail in a mutual-test, possibly due to bridging circuits in the substrate on a particular net which they could share a common bus. The affected nets are indicated by the shaded areas.

FIG. 18 shows the BSD analysis of the configuration in FIG. 10 in which both nets bridging on the paired dice (i.e., Die 3X and Die 3Y) when they drive and sense each other's boundary scan cells on matched bi-directional cells, test data collapsed on their nets, and these nets could be on substrate due to environmental stress conditions.

FIG. 19 shows that after rework, both MCM-X and MCM-Y passed, i.e., all conditions met on both Die 1X, 2X, 3X and Die 1Y, 2Y, 3Y between MCM X and MCM Y during a mutual test; no error bits are shown in TTR, thereby creating a set of Known Good Modules that passed validation.

FIG. 20 shows linkage bits in a BSDL file, which are used to define non-boundary scan pins such as power, ground or analogue signals in a boundary scan compatible device. A typical entity example in the BSDL file includes the following:

GND, VCC: linkage bit;
QC_NEC:in bit;
TDO:out bit;

TMS,TDI,TCK:in bit;
Use STD_1149_1-2001, all.

Boundary scan test may respond with errors to the corresponding linkage bits at the N-channel at the receiving end; however, it may only pass at the P-channel because this channel is designed with boundary scan compatible cells even though they share the same pin.

The BSDL file further shows various signal bits through the P-N channels, and identifies that the P channel is assigned to boundary scan cells while the N channel is assigned to linkage bits. Both channels may not be agreeable with boundary scan test. Thus, in this manner, the linkage bits did not pass during the mutual-test, but passed during self-test if a functional test is conducted. Importantly, the BSDL file shows why a single MCM under self-test is not sufficient to identify a Known Good Die by running its own boundary scan test. When test pins are mixed with boundary scan cells and linkage bits in transmission lines, the "simplex-channel" based P-N terminals operate in asynchronous mode, instead of synchronous mode of the duplex mode, of which both channels are under test by the present inventive tandem mode-based test method.

FIG. 21 diagrammatically illustrates MCM-X and MCM-Y that are configured to communicate with each other during a mutual test in an asynchronous mode and a synchronous mode. In asynchronous mode, the communication is unidirectional, i.e., transmit data (TXD) is sent in one direction and receive data (RXD) is received in an opposite direction, one direction at a time along the same data path through the same P-N channels; however, if working in synchronous mode, the communication is bidirectional and data is sent along separate data paths (i.e. different P-N channels) at the same time. As shown, the MCM-X, when configured as Host, passes the self-test but fails the "mutual-test" when configured as Peripheral terminal. On the other hand, the MCM-Y fails the mutual-test at Peripheral per linkage bit but passes "self-test" when configured as Host terminal, as shown in FIG. 21.

A matrix below illustrates either MCM-X or MCM-Y configured as either a Host or Peripheral in asynchronous mode during mutual test, but not both at the same time:

|  | Host | Peripheral |
| --- | --- | --- |
| MCM-X | MCM-X passes self-test per boundary scan cells | MCM-X fails mutual test per linkage bits |
| MCM-Y | MCM-Y passes self-test per boundary scan cells | MCM-Y fails mutual test per linkage bits |

FIG. 22 is a screen shot of a truth table showing MCM-Y fails at linkage bits, when operating as a Peripheral. Note that the top row shows the netlists and the columns indicate the boundary scan test vectors with error bits, i.e., an analogue test other than a boundary scan test.

Figure 23:
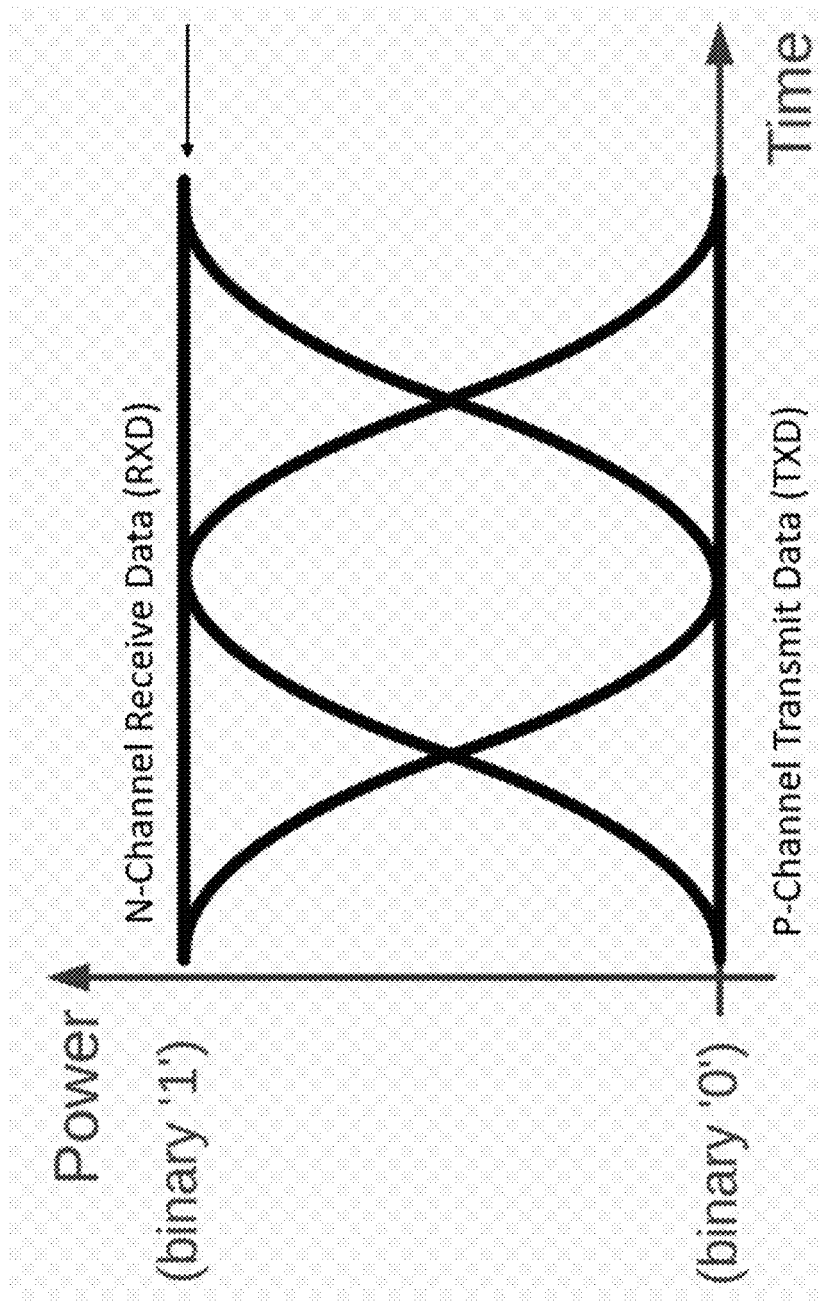
FIG. 23 illustrates functional test which are only related to linkage bits (without boundary scan cells involved) on either MCM-X or MCM-Y.

FIG. 23 shows functional tests of linkage bits in time domain during asynchronous mode transmission, illustrated on an oscilloscopic diagram, i.e., analogue outputs.

Figure 24:
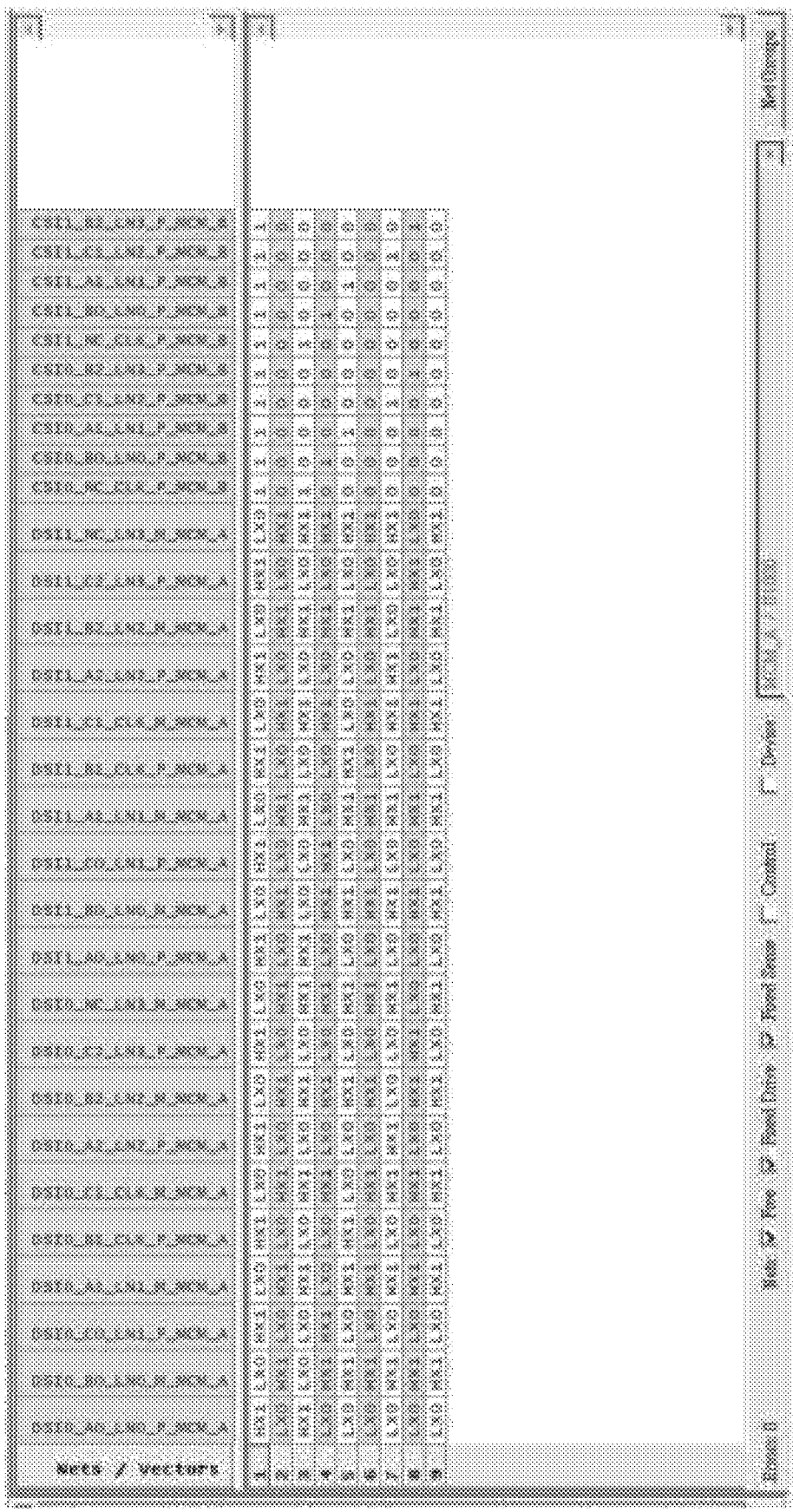
FIG. 24 illustrates boundary scan test of MCM-X or MCM-Y "pass" when boundary scan cells configured as a "host" terminal in asynchronous mode.

FIG. 24 is a screenshot of a truth table showing MCM-Y of FIG. 22 passes boundary scan test when operating as a Host.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method of debugging multi-chip modules (MCMs) made without known good die (KGDs), comprising the steps of:
   (a) Conductively connecting corresponding boundary scan cells of each identical die of a first and a second MCM for direct operative communication between said corresponding boundary scan cells, the first and the second MCMs being identically designed;
   (b) Daisy chaining by serially connecting the boundary scan cells of each die of the first MCM and the second MCM from one die to another die and from the first MCM to the second MCM;
   (c) Boundary scan testing each of the corresponding identical dice in the first and second MCMs by transmitting test vectors between the corresponding boundary scan cells of the corresponding identical dice of the first and second MCMs from one die to another die and vice versa on parallel buses;
   (d) Boundary scan testing the first MCM and then the second MCM by transmitting test vectors serially through the daisy-chained boundary scan cells of the dice of the first MCM and then through the boundary scan cells of the dice of the second MCM, and reciprocally through the boundary scan cells of the dice of the second MCM and then through the boundary scan cells of the dice of the first MCM;
   (e) Generating truth tables from Steps (c) and (d) showing boundary scan test results of the first and the second MCMs; and
   (f) Diagnosing manufacturing defects in the first and second MCMs from said truth tables by comparing their respective error bits in said truth tables.

2. The method of claim 1, further comprising the step of using said truth tables to compare false conditions of corresponding dice of the first and the second MCMs.

3. The method of claim 1, wherein Step (a) further comprises the provision of a motherboard configured to conductively connect corresponding boundary scan cells of each corresponding identical die of the first and the second MCMs.

4. The method of claim 3, further comprises the step of selectively connecting or disconnecting the boundary scan cells of a die of the first MCM from the corresponding boundary scan cells of a corresponding identical die of the second MCM.

5. The method of claim 3, further comprising the steps of (A) selectively disconnecting conductive paths between the boundary scan cells of the first MCM and the boundary scan cells of the second MCM to electrically isolate the boundary scan cells of the first MCM from the boundary scan cells of the second MCM and (B) then performing separate boundary scan tests on each of the first and the second MCMs.

6. The method of claim 1, wherein the boundary scan testing includes the transmission of test vectors configured for testing JTAG-compliant devices of the first and second MCMs.

7. The method of claim 6, wherein the test vectors are in a Serial Vector Format.

8. The method of claim 1, wherein the boundary scan testing includes an infrastructure test to validate the daisy chained boundary scan cells of the first and second MCMs, and an interconnection test to validate the busing structures and to detect any defects or errors in the first and second MCMs.

9. The method of claim 1, further comprising the step of performing a mutual test of the first and second MCMs by inputting test vectors (a) into a Test Data In (TDI) of a first JTAG interface of the first MCM and outputting through a Test Data Out (TDO) of a second JTAG interface of the second MCM, and (b) then from a Test Data Out (TDI) of the second JTAG interface of the second MCM to a TDO of the first JTAG interface of the first MCM to detect defects in one or more interconnections of the first MCM and second MCM and outputting results on Truth Table Results (TTR).

10. The method of claim 9, wherein the mutual test is performed in an asynchronous mode.

11. The method of claim 10, wherein the first MCM serves as a host in transmission of test vectors to the second MCM, and the second MCM serves as a receiver in reception of test vectors from the first MCM, for testing non-boundary scan cells involved in linkage bits by transmitting test vectors from one die of the first MCM to a corresponding identical die of the second MCM operating in an asynchronous mode, and vice versa, to thereby alternate host and peripheral roles between the first and second MCMs.

12. The method of claim 9, wherein the mutual test is performed in a synchronous mode.

13. The method of claim 1, further comprises the step of determining whether the first and second MCMs are out of synchronization with the test clock frequencies described in their Boundary Scan Description Language (BSDL) files.

14. An arrangement for debugging manufacturing defects of MCMs made without KGDs, the MCMs having boundary scan cells and non-boundary scan cells, comprising:
  (a) A motherboard configured to conductively connect corresponding boundary scan cells of corresponding identical dice of a first and a second MCM, the first and second MCMs being identically designed, and to daisy chain the boundary scan cells of the first and second MCMs and their associated dice in tandem;
  (b) Means for generating test vectors for the first and second MCMs in reference to their combined netlists;
  (c) Means for transmitting the test vectors serially across the daisy chained boundary scan cells of the first and second MCMs, from the first MCM to the second MCM and vice versa to perform infrastructural tests; and
  (d) Means for transmitting the test vectors between the corresponding boundary scan cells of the corresponding identical dice of the first and the second MCMs to conduct interconnection tests between the first and second MCMs' associated parallel buses through the motherboard.

15. The arrangement of claim 14, further comprises means for testing non-boundary scan cells involved in linkage bits by transmitting the test vectors from one die of the first MCM to a corresponding identical die of the second MCM operating in an asynchronous mode, and vice versa, to thereby alternate host and peripheral roles between the first and second MCMs.

16. The arrangement of claim 14, wherein the motherboard is configured to include a Test Access Port for the first and second MCMs, and a JTAG port.

17. The arrangement of claim 14, wherein the means for generating test vectors includes a test computer connected to a JTAG Boundary Scan Controller and configured to include Boundary Scan Description Language (BSDL) files for the first and the second MCMs.

18. The arrangement of claim 14, wherein the means for transmitting the test vectors includes a (1) JTAG Boundary Scan Controller, (2) an off-board TAP control equipment, (3) a JTAG programmer including a transceiver and a programmable TAP Pod connecting the JTAG Boundary Scan Controller and the first and the second MCMs under test through the motherboard, and (4) a computer to run an infrastructure test, an interconnection test, and a Boundary Scan Diagnostics (BSD) software.

19. The arrangement of claim 18, further comprises a switch for selectively connecting the conductive paths between the first and the second MCMs to enable a mutual test on the first and second MCMs or selectively disconnecting the conductive paths between the first and the second MCMs to enable a self-test on one of the first and second MCMs.

20. The arrangement of claim 19, wherein the switch is disposed on the motherboard.

21. The arrangement of claim 18, further comprises means for generating and displaying a Truth Table Report (TTR) from the interconnection test, and means for generating diagnostics of the TTR using the Boundary Scan Diagnostics (BSD) software.

* * * * *